US012695433B2

(12) United States Patent
Yoshida et al.

(10) Patent No.: US 12,695,433 B2
(45) Date of Patent: Jul. 28, 2026

(54) PHASE SHIFTER AND ANTENNA DEVICE

(71) Applicant: NEC Corporation, Minato-ku (JP)

(72) Inventors: Kohei Yoshida, Tokyo (JP); Kenji Wakafuji, Tokyo (JP); Ryota Nihei, Tokyo (JP); Kazuyuki Hayashi, Tokyo (JP); Fujio Okumura, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 48 days.

(21) Appl. No.: 18/876,735

(22) PCT Filed: Sep. 8, 2022

(86) PCT No.: PCT/JP2022/033666
§ 371 (c)(1),
(2) Date: Dec. 19, 2024

(87) PCT Pub. No.: WO2024/053040
PCT Pub. Date: Mar. 14, 2024

(65) Prior Publication Data
US 2025/0373221 A1 Dec. 4, 2025

(51) Int. Cl.
*H03H 7/18* (2006.01)
*H01P 1/18* (2006.01)
(Continued)

(52) U.S. Cl.
CPC ................. *H03H 7/18* (2013.01); *H01P 1/18* (2013.01); *H01Q 3/36* (2013.01); *H01Q 3/38* (2013.01); *H01Q 9/0407* (2013.01)

(58) Field of Classification Search
CPC ........... H03H 7/18–21; H01Q 3/30–42; H01Q 3/2694; H01Q 9/0407; H01P 1/18–195
See application file for complete search history.

(56) References Cited

U.S. PATENT DOCUMENTS

| | | | | |
|---|---|---|---|---|
| 4,445,098 A * | 4/1984 | Sharon | H01P 1/195 | 333/158 |
| 6,281,838 B1 * | 8/2001 | Hong | H01G 5/18 | 333/139 |

(Continued)

FOREIGN PATENT DOCUMENTS

| | | |
|---|---|---|
| JP | H08-097602 A | 4/1996 |
| JP | 2004088591 A * | 3/2004 |

(Continued)

OTHER PUBLICATIONS

International Search Report for PCT Application No. PCT/JP2022/033666, mailed on Nov. 8, 2022.

(Continued)

*Primary Examiner* — Ab Salam Alkassim, Jr.
(74) *Attorney, Agent, or Firm* — Sughrue Mion, PLLC

(57) ABSTRACT

A phase shifter that includes a 90-degree hybrid circuit and a variable-length stub group including two variable-length stubs connected to the 90-degree hybrid circuit. The variable-length stub includes a first switch connected to the 90-degree hybrid circuit and including vanadium dioxide of a first composition that phase-transitions between an insulation phase and a metal phase in a first phase transition temperature range, a first stub connected to the first switch, a second switch connected to the first stub and including vanadium dioxide of a second composition that phase-transitions between an insulation phase and a metal phase in a second phase transition temperature range higher than the first phase transition temperature range, and a second stub connected to the second switch and having an end grounded.

10 Claims, 14 Drawing Sheets

(51) Int. Cl.

| | |
|---|---|
| ***H01Q 3/36*** | (2006.01) |
| ***H01Q 3/38*** | (2006.01) |
| ***H01Q 9/04*** | (2006.01) |

(56) References Cited

U.S. PATENT DOCUMENTS

| | | | | |
|---|---|---|---|---|
| 7,355,492 | B2 * | 4/2008 | Hyman | H03H 17/08 333/140 |
| 7,642,881 | B1 * | 1/2010 | Robinson | H01P 1/2039 257/108 |
| 10,062,946 | B2 * | 8/2018 | Sharma | H01P 1/18 |
| 11,545,756 | B2 * | 1/2023 | Qi | H01P 1/18 |
| 2005/0270122 | A1 * | 12/2005 | Hyman | H01P 1/18 333/164 |
| 2021/0359408 | A1 * | 11/2021 | Theofanopoulos | H01Q 3/36 |
| 2024/0380096 | A1 * | 11/2024 | Nihei | H01Q 1/243 |
| 2025/0105505 | A1 * | 3/2025 | Gungor | H01P 1/184 |
| 2025/0260149 | A1 * | 8/2025 | Nihei | H01Q 21/065 |
| 2025/0260150 | A1 * | 8/2025 | Nihei | H01Q 21/065 |
| 2025/0260162 | A1 * | 8/2025 | Yoshida | H01Q 3/36 |

FOREIGN PATENT DOCUMENTS

| | | | | |
|---|---|---|---|---|
| JP | 2016-171501 | A | | 9/2016 |
| JP | 2019029722 | A | * | 2/2019 |

OTHER PUBLICATIONS

English translation of Written opinion for PCT Application No. PCT/JP2022/033666, mailed on Nov. 8, 2022.

E. A. Casu et al., "Shunt capacitive switches based on VO2 metal insulator transition for RF phase shifter applications," 2017 47th European Solid-State Device Research Conference (ESSDERC), 2017, pp. 232-235.

Li Liangyu. "Experimental Investigation of Integrated Tunable Passive Microwave Devices," Doctoral dissertation, University of Dayton, 2020, pp. 23.

Williamson, Thomas G, et al, "Novel Ka-Band Phase Shifter Design Based on Vanadium Dioxide Switches for 5G Applications", 2022 1EEE International Symposium on Antennas and Propagation and USNC-URSI Radio Science Meeting, Jul. 15, 2022, pp. 49-50 Figs. 1-3.

* cited by examiner

PHASE SHIFTER AND ANTENNA DEVICE

This application is a National Stage Entry of PCT/JP2022/033666 filed on Sep. 8, 2022, the contents of all of which are incorporated herein by reference, in their entirety.

TECHNICAL FIELD

The present disclosure relates to a phase shifter and the like mounted on an antenna device.

BACKGROUND ART

For mobile communication after the fifth generation mobile communication, an antenna device compatible with radio waves in a high frequency band has been developed. In such an antenna device, a phase shifter is mounted on a preceding stage of the antenna element. By changing the excitation phase of the antenna element using the phase shifter, a beam having a desired directivity can be formed. For example, when a switched line phase shifter is used, a phase shift range up to 360 degrees can be covered, so that a large scanning angle can be achieved. However, it is difficult to incorporate such a phase shifter in a small antenna device such as a patch antenna.

PTL 1 discloses a phased array antenna including a flexible variable phase shifter. The phase shifter of PTL 1 includes a flexible 90-degree hybrid coupler and a flexible conductive polymer actuator. The phase shifter of PTL 1 controls the phase of the high-frequency signal input to the 90-degree hybrid coupler by a combination of the 90-degree hybrid coupler and the conductive polymer actuator.

NPL 1 reports a phase shifter including a switch using metal-insulator phase transition (hereinafter, referred to as a phase transition) of vanadium dioxide $VO_2$. When the temperature of the vanadium dioxide $VO_2$ is increased from room temperature, the electrical resistance of the vanadium dioxide $VO_2$ rapidly decreases at around 67 degrees Celsius, and the vanadium dioxide $VO_2$ undergoes a phase transition from an insulator to a metal. The phase shifter of NPL 1 causes phase transition of vanadium dioxide $VO_2$ by an electrical trigger to generate a phase shift.

NPL 2 reports a variable integrated passive element using a vanadium dioxide $VO_2$ thin film. NPL 2 (page 23 etc.) describes a change in phase transition temperature according to a dopant added to vanadium dioxide $VO_2$. By adding chromium Cr, aluminum Al, or germanium Ge, the phase transition temperature of vanadium dioxide $VO_2$ increases. On the other hand, By adding tungsten W, magnesium Mg, iron Fe, molybdenum Mo, fluorine F, or niobium Nb, the phase transition temperature of vanadium dioxide $VO_2$ decreases.

CITATION LIST

Patent Literature

PTL 1: JP 2016-171501 A

Non Patent Literature

NPL 1: E. A. Casu et al., "Shunt capacitive switches based on $VO_2$ metal insulator transition for RF phase shifter applications," 2017 47th European Solid-State Device Research Conference (ESSDERC), 2017, pp.232-235.

NPL 2: Li Liangyu. "Experimental Investigation of Integrated Tunable Passive Microwave Devices," Doctoral dissertation, University of Dayton, 2020, pp. 23.

SUMMARY OF INVENTION

Technical Problem

By combining PTL 1 and NPLs 1 and 2, a phase shifter including a switch using the phase transition of vanadium dioxide $VO_2$ can be achieved. The switch using the phase transition of vanadium dioxide $VO_2$ can control ON/OFF by controlling the temperature between a temperature lower than the phase transition temperature and a temperature higher than the phase transition temperature. Such a phase shifter can be miniaturized, and thus can be incorporated in a small antenna device.

In the device on which the phase shifter including the switch using the phase transition of the vanadium dioxide $VO_2$ is mounted, when the device is placed under an environmental temperature close to the phase transition temperature of the vanadium dioxide $VO_2$, the ON/OFF state of the switch becomes unstable. For example, in a vehicle under the hot sun in summer, the environmental temperature may be close to the phase transition temperature of vanadium dioxide $VO_2$. If the cooling mechanism is mounted on the device, the inside of the device can be maintained at a low temperature. However, it is difficult to mount such a cooling mechanism on a small antenna device. Even if the cooling mechanism can be mounted on the antenna device, power consumption significantly increases.

An object of the present disclosure is to provide a phase shifter or the like that can be stably controlled without depending on an environmental temperature.

Solution to Problem

A phase shifter according to an aspect of the present disclosure includes a 90-degree hybrid circuit and a variable-length stub group including two variable-length stubs connected to the 90-degree hybrid circuit. The variable-length stub includes a first switch connected to the 90-degree hybrid circuit and including vanadium dioxide of a first composition that phase-transitions between an insulation phase and a metal phase in a first phase transition temperature range, a first stub connected to the first switch, a second switch connected to the first stub and including vanadium dioxide of a second composition that phase-transitions between an insulation phase and a metal phase in a second phase transition temperature range higher than the first phase transition temperature range, and a second stub connected to the second switch and having an end grounded.

Advantageous Effects of Invention

According to the present disclosure, it is possible to provide a phase shifter or the like that can be stably controlled without depending on the environmental temperature.

EXAMPLE EMBODIMENTS

Figure 1:
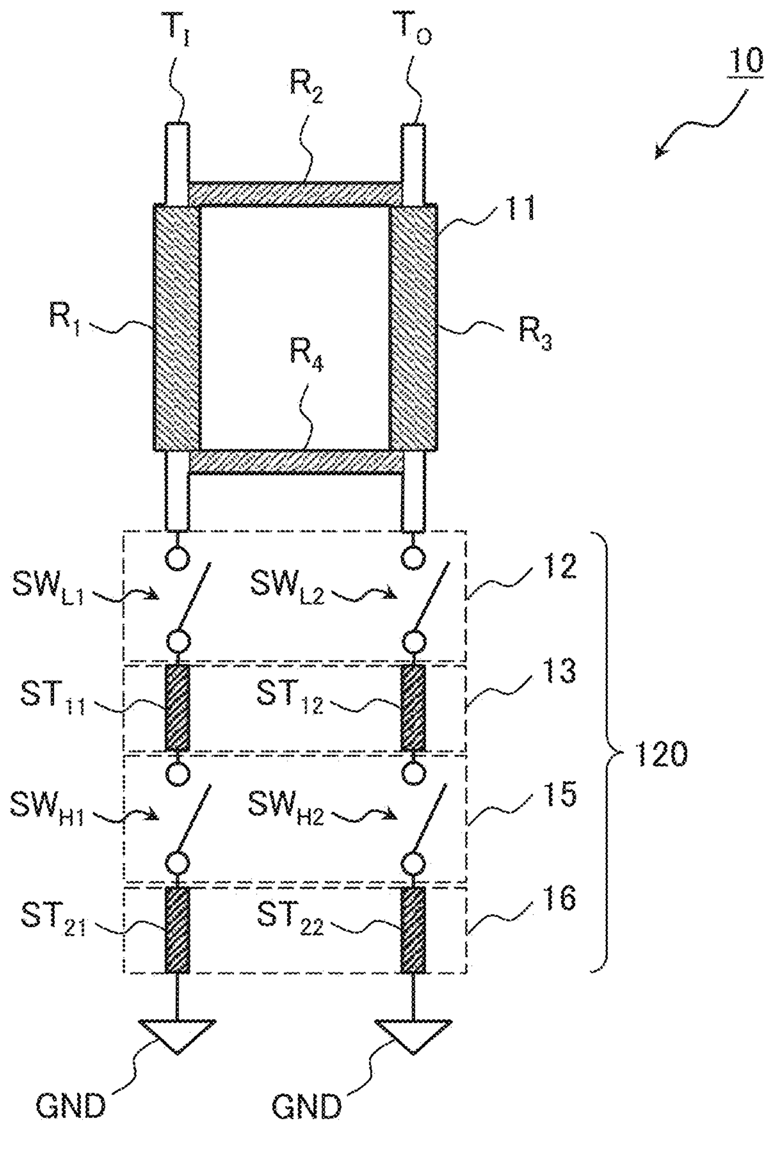
FIG. 1 is a conceptual diagram illustrating an example of a configuration of a phase shifter according to a first example embodiment.

Hereinafter, example embodiments of the present invention will be described with reference to the drawings. However, the example embodiments described below may be technically limited for carrying out the present invention, but the scope of the invention is not limited to the following. In all the drawings used in the following description of the example embodiment, the same reference numerals are given to the same parts unless there is a particular reason. In the following example embodiments, repeated description of similar configurations and operations may be omitted.

First Example Embodiment

First, a phase shifter according to a first example embodiment will be described with reference to the drawings. For example, the phase shifter of the present example embodiment is mounted on an antenna device including a patch antenna that is a type of planar antenna. The phase shifter of the present example embodiment can be applied to transmission of a transmission target radio wave and reception of a reception target radio wave arriving from the outside. For example, the phase shifter of the present example embodiment can be applied to an antenna device used for transmission and reception of a transmission/reception target signal in a high frequency band used in mobile communication after the fifth generation mobile communication. Hereinafter, the electrical length of the transmission/reception target signal on the board is denoted by $\lambda$ ($\lambda$ is a real number).

Configuration

FIG. 1 is a conceptual diagram illustrating an example of a configuration of a phase shifter 10 according to the present example embodiment. The phase shifter 10 includes a 90-degree hybrid circuit 11, a first switch group 12, a first stub group 13, a second switch group 15, and a second stub group 16. The phase shifter 10 has an input end $T_I$ to which a phase-shift target signal is input and an output end $T_O$ from which a phase-shifted signal is output. Each of the first switch group 12 and the second switch group 15 includes two switches SW. The switch SW is a phase transition switch using the phase transition between the insulation phase and the metal phase of the vanadium dioxide $VO_2$. The open/close state of each switch SW is individually controlled by a control circuit (not illustrated). The first stub group 13 and the second stub group 16 include two stubs ST.

Vanadium dioxide $VO_2$ exhibits a phase transition between an insulation phase and a metal phase in a temperature range (referred to as a phase transition temperature range) including a phase transition temperature. In a temperature range (low temperature range) lower than the phase transition temperature range, vanadium dioxide $VO_2$ has a monoclinic structure (insulation phase). In a temperature range (high temperature range) higher than the phase transition temperature range, vanadium dioxide $VO_2$ has a tetragonal structure (metal phase). When the temperature is increased from the low temperature range toward the high temperature range and exceeds the phase transition temperature range (also referred to as a metal transition temperature range), the vanadium dioxide $VO_2$ undergoes a phase transition from an insulation phase to a metal phase. On the other hand, when the temperature decreases from the high temperature range toward the low temperature range and falls below the phase transition temperature range (also referred to as an insulation transition temperature range), the vanadium dioxide $VO_2$ undergoes a phase transition from a metal phase to an insulation phase. Usually, since the metal transition temperature range is higher than the insulation transition temperature range, the phase transition of the insulation phase-metal phase of vanadium dioxide $VO_2$ according to the temperature change exhibits hysteresis.

The plurality of switches SW included in the first switch group 12 and the second switch group 15 and the plurality of stubs ST included in the first stub group 13 and the second stub group 16 constitute a variable-length stub group 120. The variable-length stub group 120 includes two variable-length stubs. The variable-length stubs include two stubs ST connected in series via the switch SW included in the second switch group 15. The two variable-length stubs are connected to both ends of any transmission line included in the 90-degree hybrid circuit 11. The length of the variable-length stub is controlled according to the open/close state of the SW. The electrical lengths of the two variable-length stubs are the same regardless of the open/close state of the SW.

Figure 2:
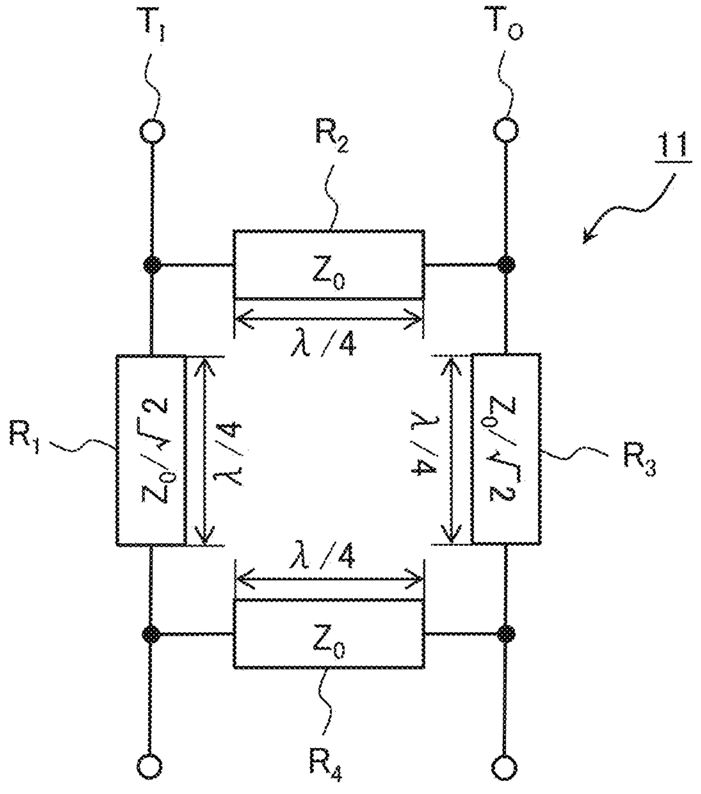
FIG. 2 is a conceptual diagram for explaining a 90-degree hybrid circuit included in the phase shifter according to the first example embodiment.

FIG. 2 is a conceptual diagram for explaining the 90-degree hybrid circuit 11. The 90-degree hybrid circuit 11 includes four transmission lines ($R_1$, $R_2$, $R_3$, $R_4$). The electrical length of each of the four transmission lines ($R_1$, $R_2$, $R_3$, $R_4$) is $\lambda/4$ (90 degrees).

The transmission line $R_1$ is a transmission line having an electrical length of $\lambda/4$. The characteristic impedance of the transmission line $R_1$ is $Z_0/\sqrt{2}$. The first end of the transmission line $R_1$ is connected to an input end $T_1$. The first end of the transmission line $R_1$ is connected to the first end of the transmission line $R_2$. The second end of the transmission line $R_1$ is connected to the first end of the transmission line $R_4$. The second end of the transmission line $R_1$ is connected to the first end of a first switch $SW_{L1}$ included in the first switch group 12.

The transmission line $R_2$ is a transmission line having an electrical length of $\lambda/4$. The characteristic impedance of the transmission line $R_2$ is $Z_0$. The first end of the transmission line $R_2$ is connected to the input end $T_I$. The first end of the transmission line $R_2$ is connected to the first end of the transmission line $R_1$. The second end of the transmission line $R_2$ is connected to the output end $T_O$. The second end of the transmission line $R_2$ is connected to the first end of the transmission line $R_3$.

The transmission line $R_3$ is a transmission line having an electrical length of $\lambda/4$. The characteristic impedance of the transmission line $R_2$ is $Z_0/\sqrt{2}$. The first end of the transmission line $R_3$ is connected to the output end $T_O$. The first end of the transmission line $R_3$ is connected to the second end of the transmission line $R_2$. The second end of the transmission line $R_3$ is connected to the second end of the transmission line $R_4$. The second end of the transmission line $R_3$ is connected to the first end of a first switch $SW_{L2}$ included in the first switch group 12.

The transmission line $R_4$ is a transmission line having an electrical length of $\lambda/4$. The characteristic impedance of the transmission line $R_4$ is $Z_0$. The first end of the transmission line $R_4$ is connected to the second end of the transmission line $R_1$. The first end of the transmission line $R_4$ is connected to the first end of the first switch $SW_{L1}$ included in the first switch group 12. The second end of the transmission line $R_4$ is connected to the second end of the transmission line $R_3$. The second end of the transmission line $R_4$ is connected to the first end of the first switch $SW_{L2}$ included in the first switch group 12.

The first switch group 12 includes the first switch $SW_{L1}$ and the first switch $SW_{L2}$. The first switch $SW_{L1}$ and the first switch $SW_{L2}$ are phase transition switches using the phase transition between the insulation phase and the metal phase of the vanadium dioxide $VO_2$. The first switch $SW_{L1}$ and the first switch $SW_{L2}$ include vanadium dioxide $VO_2$ of a first composition that undergoes phase transition from an insulation phase to a metal phase in a first phase transition temperature range $T_L$. The phase transition of the insulation phase-metal phase of vanadium dioxide $VO_2$ exhibits hysteresis. Therefore, a metal transition temperature range in which the phase transition from the insulation phase (low temperature) to the metal phase (high temperature) occurs is different from an insulation transition temperature range in which the phase transition from the metal phase (high temperature) to the insulation phase (low temperature) occurs. Hereinafter, the metal transition temperature range and the insulation transition temperature range are referred to as a first phase transition temperature range $T_L$ without distinction. The first phase transition temperature range $T_L$ is relevant to a temperature range including the metal transition temperature range and the insulation transition temperature range.

For example, the first switch $SW_{L1}$ and the first switch $SW_{L2}$ include vanadium dioxide $VO_2$ to which no additive element is added. For example, an additive element may be added to vanadium dioxide $VO_2$ to be included in the first switch $SW_{L1}$ and the first switch $SW_{L2}$. For example, an additive element for lowering the phase transition temperature is added to vanadium dioxide $VO_2$ to be included in the first switch $SW_{L1}$ and the first switch $SW_{L2}$. For example, when an additive element such as tungsten W, magnesium Mg, iron Fe, molybdenum Mo, fluorine F, or niobium Nb is added, the phase transition temperature of vanadium dioxide $VO_2$ decreases.

The vanadium dioxide $VO_2$ is an insulation phase at a temperature lower than the first phase transition temperature range $T_L$. Therefore, at a temperature lower than the first phase transition temperature range $T_L$, the first switch $SW_{L1}$ and the first switch $SW_{L2}$ are turned OFF. The vanadium dioxide $VO_2$ is a metal phase at a temperature higher than the first phase transition temperature range $T_L$. Therefore, at a temperature higher than the first phase transition temperature range $T_L$, the first switch $SW_{L1}$ and the first switch $SW_{L2}$ are turned ON. FIG. 1 illustrates a state in which the switches SW (first switch $SW_{L1}$, first switch $SW_{L2}$) included in the first switch group 12 are temperature-controlled to a temperature lower than the first phase transition temperature range $T_L$. In the state of FIG. 1, the switch SW included in the first switch group 12 is turned OFF. In the phase transition between the insulation phase and the metal phase of vanadium dioxide $VO_2$, the insulation transition temperature range is higher than the metal transition temperature range. Therefore, when the temperature of the switch SW is controlled to a temperature above the metal transition temperature range, the switch SW is switched from OFF (insulation phase) to ON (metal phase). On the other hand, when the temperature of the switch SW is controlled to a temperature lower than the insulation transition temperature range, the switch SW is switched from ON (metal phase) to OFF (insulation phase).

The first end of the first switch $SW_{L1}$ is connected to the second end of the transmission line $R_1$ and the first end of the transmission line $R_4$. The second end of the first switch $SW_{L1}$ is connected to the first end of a first stub $ST_{11}$ included in the first stub group 13. In a state where the temperature is controlled to be lower than the first phase transition temperature range $T_L$, the first switch $SW_{L1}$ is turned OFF. In a state where the temperature is controlled to be higher than the first phase transition temperature range $T_L$, the first switch $SW_{L1}$ is turned ON.

The first end of the first switch $SW_{L2}$ is connected to the second end of the transmission line $R_3$ and the second end of the transmission line $R_4$. The second end of the first switch $SW_{L2}$ is connected to the first end of a first stub $ST_{12}$ included in the first stub group 13. In a state where the temperature is controlled to be lower than the first phase transition temperature range $T_L$, the first switch $SW_{L2}$ is turned OFF. In a state where the temperature is controlled to be higher than the first phase transition temperature range $T_L$, the first switch $SW_{L2}$ is turned ON.

Figure 3:
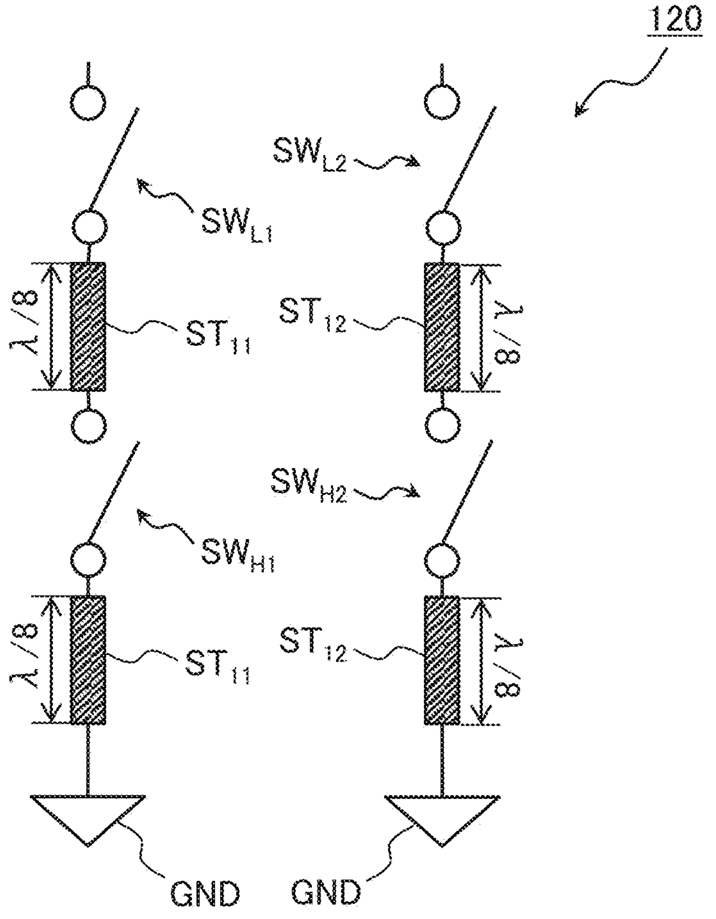
FIG. 3 is a conceptual diagram for explaining a variable-length stub group included in the phase shifter according to the first example embodiment.

The first stub group 13 includes the first stub $ST_{11}$ and the first stub $ST_{12}$. FIG. 3 is a conceptual diagram for explaining electrical lengths of the stubs ST included in the first stub group 13 and the second stub group 16. The electrical length of each of the first stub $ST_{11}$ and the first stub $ST_{12}$ is $\lambda/8$ (45 degrees). That is, the electrical lengths of the first stub $ST_{11}$ and the first stub $ST_{12}$ are half the electrical length of the four transmission lines ($R_1$, $R_2$, $R_3$, $R_4$) included in the 90-degree hybrid circuit 11.

The first stub $ST_{11}$ is a stub having an electrical length of $\lambda/8$. The first end of the first stub $ST_{11}$ is connected to the second end of the first switch $SW_{L1}$ included in the first switch group 12. The second end of the first stub $ST_{11}$ is connected to the first end of a second switch $SW_{H1}$ included in the second switch group. In a case where the first switch $SW_{L1}$ is turned ON and the second switch $SW_{H1}$ is turned OFF, the first stub $ST_{11}$ functions as an open stub having an electrical length of λ/8. In a case where the first switch $SW_{L1}$ is turned ON and the second switch $SW_{H1}$ is turned ON, the first stub $ST_{11}$ functions as a short stub having an electrical length of λ/4 together with a second stub $ST_{21}$ included in the second stub group 16.

The first stub $ST_{12}$ is a stub having an electrical length of λ/8. The first end of the first stub $ST_{12}$ is connected to the second end of the first switch $SW_{L2}$ included in the first switch group 12. The second end of the first stub $ST_{12}$ is connected to the first end of a second switch $SW_{H2}$ included in the second switch group. In a case where the first switch $SW_{L2}$ is turned ON and the second switch $SW_{H2}$ is turned OFF, the first stub $ST_{12}$ functions as an open stub having an electrical length of λ/8. In a case where the first switch $SW_{L2}$ is turned ON and the second switch $SW_{H2}$ is turned ON, the first stub $ST_{12}$ functions as a short stub having an electrical length of λ/4 together with a second stub $ST_{22}$ included in the second stub group 16.

The second switch group 15 includes the second switch $SW_{H1}$ and the second switch $SW_{H2}$. The second switch $SW_{H1}$ and the second switch $SW_{H2}$ are phase transition switches using the phase transition between the insulation phase and the metal phase of the vanadium dioxide $VO_2$. The second switch $SW_{H1}$ and the second switch $SW_{H2}$ include vanadium dioxide $VO_2$ of a second composition that undergoes phase transition from an insulation phase to a metal phase in a second phase transition temperature range $T_H$. The second phase transition temperature range $T_H$ is higher than the first phase transition temperature range $T_L$. The phase transition of the insulation phase-metal phase of vanadium dioxide $VO_2$ exhibits hysteresis. Therefore, a metal transition temperature range in which the phase transition from the insulation phase (low temperature) to the metal phase (high temperature) occurs is different from an insulation transition temperature range in which the phase transition from the metal phase (high temperature) to the insulation phase (low temperature) occurs. Hereinafter, the metal transition temperature range and the insulation transition temperature range are referred to as the second phase transition temperature range $T_H$ without distinction. The second phase transition temperature range $T_H$ is relevant to a temperature range including the metal transition temperature range and the insulation transition temperature range.

For example, an additive element for increasing the phase transition temperature is added to vanadium dioxide $VO_2$ to be included in the second switch $SW_{H1}$ and the second switch $SW_{H2}$. For example, when chromium Cr, aluminum Al, or germanium Ge is added, the phase transition temperature of vanadium dioxide $VO_2$ increases. There may be a case where an additive element having a low phase transition temperature is added to the vanadium dioxide $VO_2$ of the first switch $SW_{L1}$ and the first switch $SW_{L2}$ included in the first switch group 12. In such a case, if the second phase transition temperature range $T_H$ is higher than the first phase transition temperature range $T_L$, the second switch $SW_{H1}$ and the second switch $SW_{H2}$ may include vanadium dioxide $VO_2$ to which no additive element is added.

The vanadium dioxide $VO_2$ is an insulation phase at a temperature lower than the second phase transition temperature range $T_H$. Therefore, at a temperature lower than the second phase transition temperature range $T_H$, the second switch $SW_{H1}$ and the second switch $SW_{H2}$ are turned OFF. The vanadium dioxide $VO_2$ is a metal phase at a temperature higher than the second phase transition temperature range $T_H$. Therefore, at a temperature higher than the second phase transition temperature range $T_H$, the second switch $SW_{H1}$ and the second switch $SW_{H2}$ are turned ON. FIG. 1 illustrates a state in which the switches SW (second switch $SW_{H1}$, second switch $SW_{H2}$) included in the second switch group 15 are temperature-controlled to be a temperature lower than the second phase transition temperature range $T_H$. In the state of FIG. 1, all the switches SW included in the second switch group 15 are turned OFF. In the phase transition between the insulation phase and the metal phase of vanadium dioxide $VO_2$, the insulation transition temperature range is higher than the metal transition temperature range. Therefore, when the temperature of the switch SW is controlled to a temperature above the metal transition temperature range, the switch SW is switched from OFF (insulation phase) to ON (metal phase). On the other hand, when the temperature of the switch SW is controlled to a temperature lower than the insulation transition temperature range, the switch SW is switched from ON (metal phase) to OFF (insulation phase).

The first end of the second switch $SW_{H1}$ is connected to the second end of the first stub $ST_{11}$ included in the first stub group 13. The second end of the second switch $SW_{H1}$ is connected to the first end of the second stub $ST_{21}$ included in the second stub group 16. In a state where the temperature is controlled to be lower than the second phase transition temperature range $T_H$, the second switch $SW_{H1}$ is turned OFF. In a state where the temperature is controlled to be higher than the second phase transition temperature range $T_H$, the second switch $SW_{H1}$ is turned ON.

The first end of the second switch $SW_{H2}$ is connected to the second end of the first stub $ST_{12}$ included in the first stub group 13. The second end of the second switch $SW_{H2}$ is connected to the first end of the second stub $ST_{22}$ included in the second stub group 16. The second switch $SW_{H2}$ is turned OFF at a temperature lower than the second phase transition temperature range $T_H$. The second switch $SW_{H2}$ is turned ON at a temperature higher than the second phase transition temperature range $T_H$.

The second stub group 16 includes the second stub $ST_{21}$ and the second stub $ST_{22}$. As illustrated in FIG. 3, the electrical lengths of the second stub $ST_{21}$ and the second stub $ST_{22}$ are both λ/8 (45 degrees). The electrical lengths of the second stub $ST_{21}$ and the second stub $ST_{22}$ are the same as the electrical lengths of the first stub $ST_{11}$ and the first stub $ST_{12}$ included in the first stub group 13.

The second stub $ST_{21}$ is a stub having an electrical length of λ/8. The first end of the second stub $ST_{21}$ is connected to the second end of the second switch $SW_{H1}$ included in the second switch group 15. The second end (also referred to as a terminal) of the second stub $ST_{21}$ is grounded. In a case where the second switch $SW_{H1}$ is turned OFF, the second stub $ST_{21}$ does not function as a stub. In a case where the first switch $SW_{L1}$ is turned ON and the second switch $SW_{H1}$ is turned ON, the second stub $ST_{21}$ functions as a short stub having an electrical length of λ/4 together with the first stub $ST_{11}$ included in the first stub group 13.

The second stub $ST_{22}$ is a stub having an electrical length of λ/8. The first end of the second stub $ST_{22}$ is connected to the second end of the second switch $SW_{H1}$ included in the second switch group 15. The second end (also referred to as a terminal) of the second stub $ST_{22}$ is grounded. In a case where the second switch $SW_{H2}$ is turned OFF, the second stub $ST_{22}$ does not function as a stub. In a case where the first switch $SW_{L2}$ is turned ON and the second switch $SW_{H2}$ is turned ON, the second stub $ST_{22}$ functions as a short stub having an electrical length of λ/4 together with the first stub $ST_{12}$ included in the first stub group 13.

Figure 4:
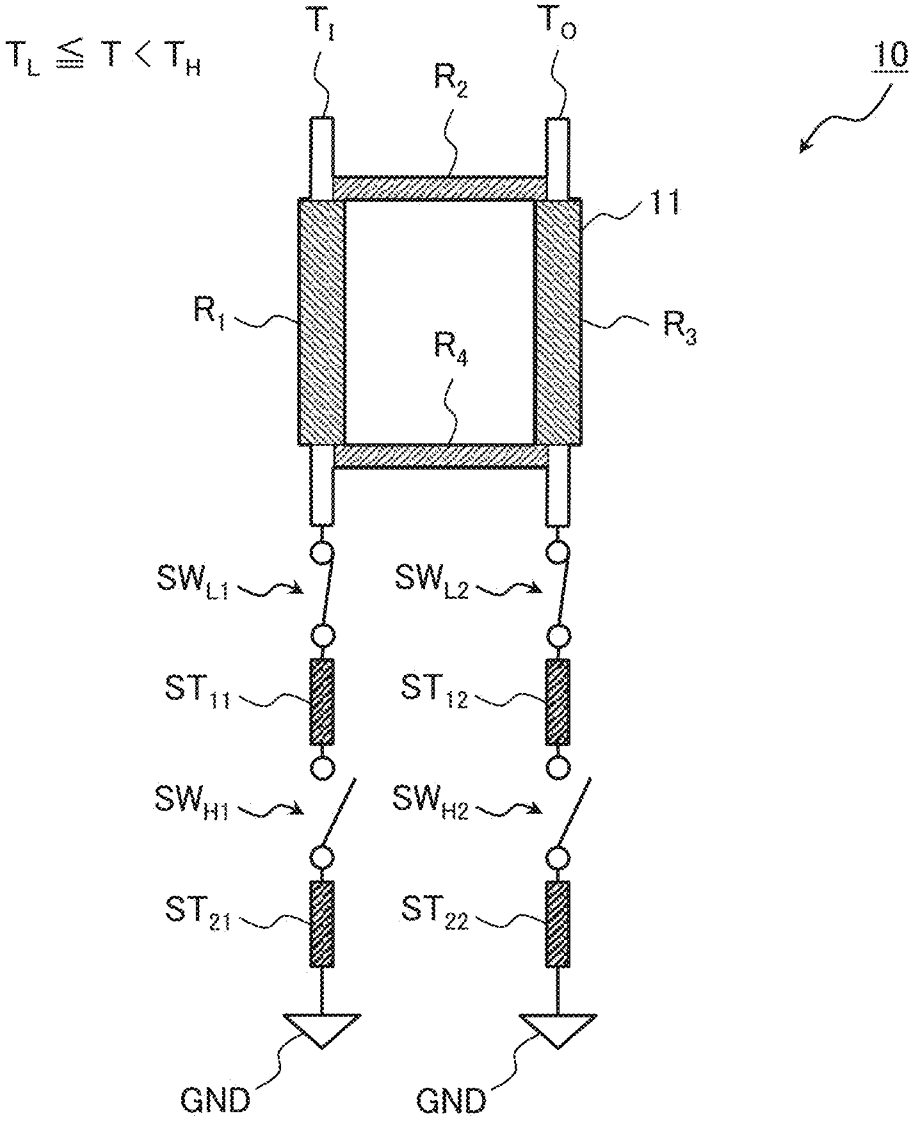
FIG. 4 is a conceptual diagram illustrating an example of an open/close state of a switch included in the phase shifter according to the first example embodiment.

FIG. 4 is a conceptual diagram illustrating a connection state of the first switch group 12 and the second switch group 15 in a case where an environmental temperature T is in a temperature range (first temperature range) between the first phase transition temperature range $T_L$ and the second phase transition temperature range $T_H$. A temperature range in which the environmental temperature T is lower than the first phase transition temperature range $T_L$ is referred to as a normal temperature range. In the first temperature range, the first switch $SW_{L1}$ and the first switch $SW_{L2}$ included in the first switch group 12 are always turned ON and cannot be controlled. On the other hand, in the first temperature range, the second switch $SW_{H1}$ and the second switch $SW_{H2}$ included in the second switch group 15 can be controlled. When the second switch $SW_{H1}$ and the second switch $SW_{H2}$ are turned OFF in the first temperature range, the first stub $ST_{11}$ and the first stub $ST_{12}$ included in the first stub group 13 function as open stubs having an electrical length of λ/8.

Figure 5:
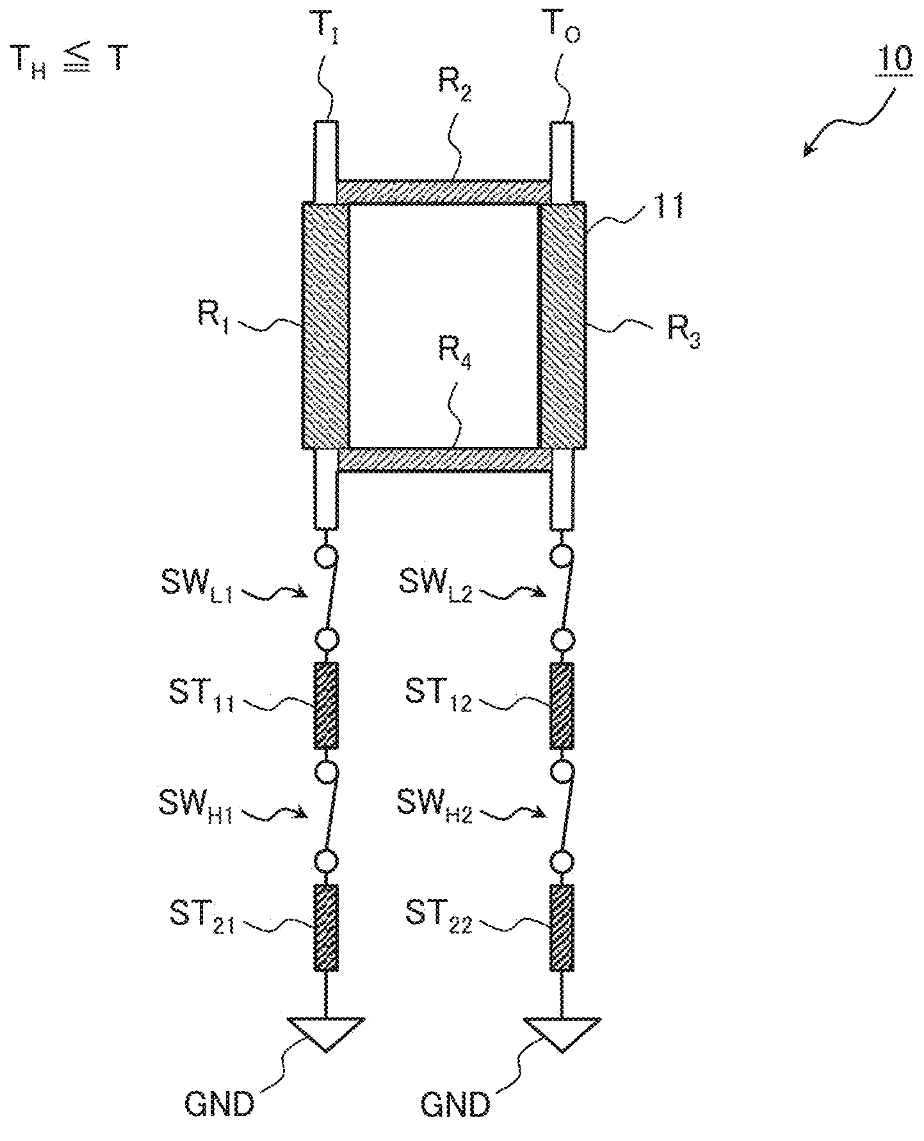
FIG. 5 is a conceptual diagram illustrating an example of an open/close state of a switch included in the phase shifter according to the first example embodiment.

FIG. 5 is a conceptual diagram illustrating a connection state of the first switch group 12 and the second switch group 15 in a case where the environmental temperature T is in a temperature range (second temperature range) equal to or higher than the second phase transition temperature range $T_H$. In the second temperature range, the first switch $SW_{L1}$ and the first switch $SW_{L2}$ included in the first switch group 12 are always turned ON and cannot be controlled. In the second temperature range, the second switch $SW_{H1}$ and the second switch $SW_{H2}$ included in the second switch group 15 are also always turned ON and cannot be controlled. In the second temperature range, the first stub $ST_{11}$ and the first stub $ST_{12}$ included in the first stub group 13 and the second stub $ST_{21}$ and the second stub $ST_{22}$ included in the second stub group 16 function as short stubs having an electrical length of λ/4.

In a case where the environmental temperature T is in a temperature range (normal temperature range) lower than the first phase transition temperature range $T_L$, all of the first switch $SW_{L1}$, the first switch $SW_{L2}$, the second switch $SW_{H1}$, and the second switch $SW_{H2}$ can be controlled.

Modification

Figure 6:
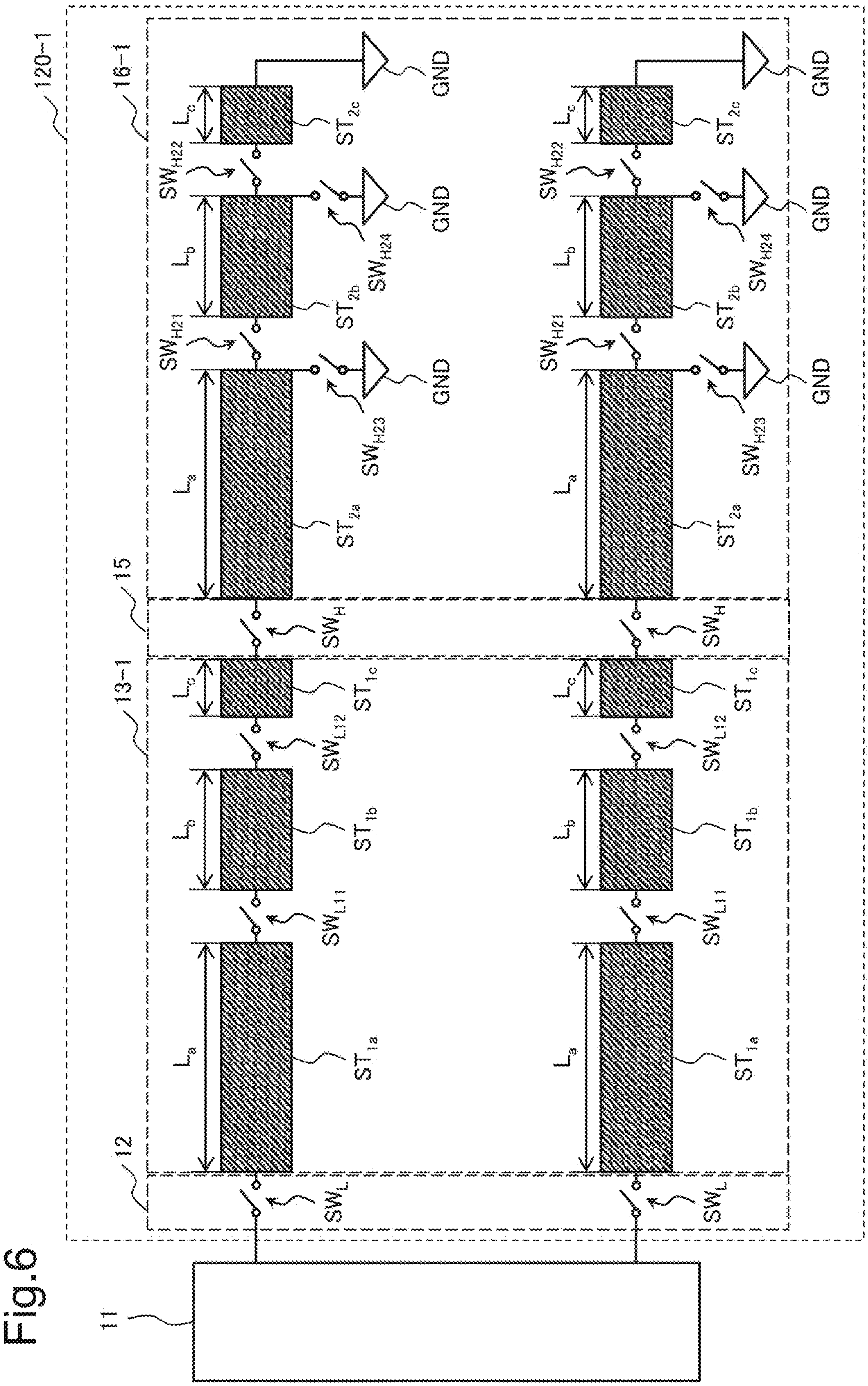
FIG. 6 is a conceptual diagram for explaining a variable-length stub group included in a phase shifter according to a modification of the first example embodiment.
Figure 7:
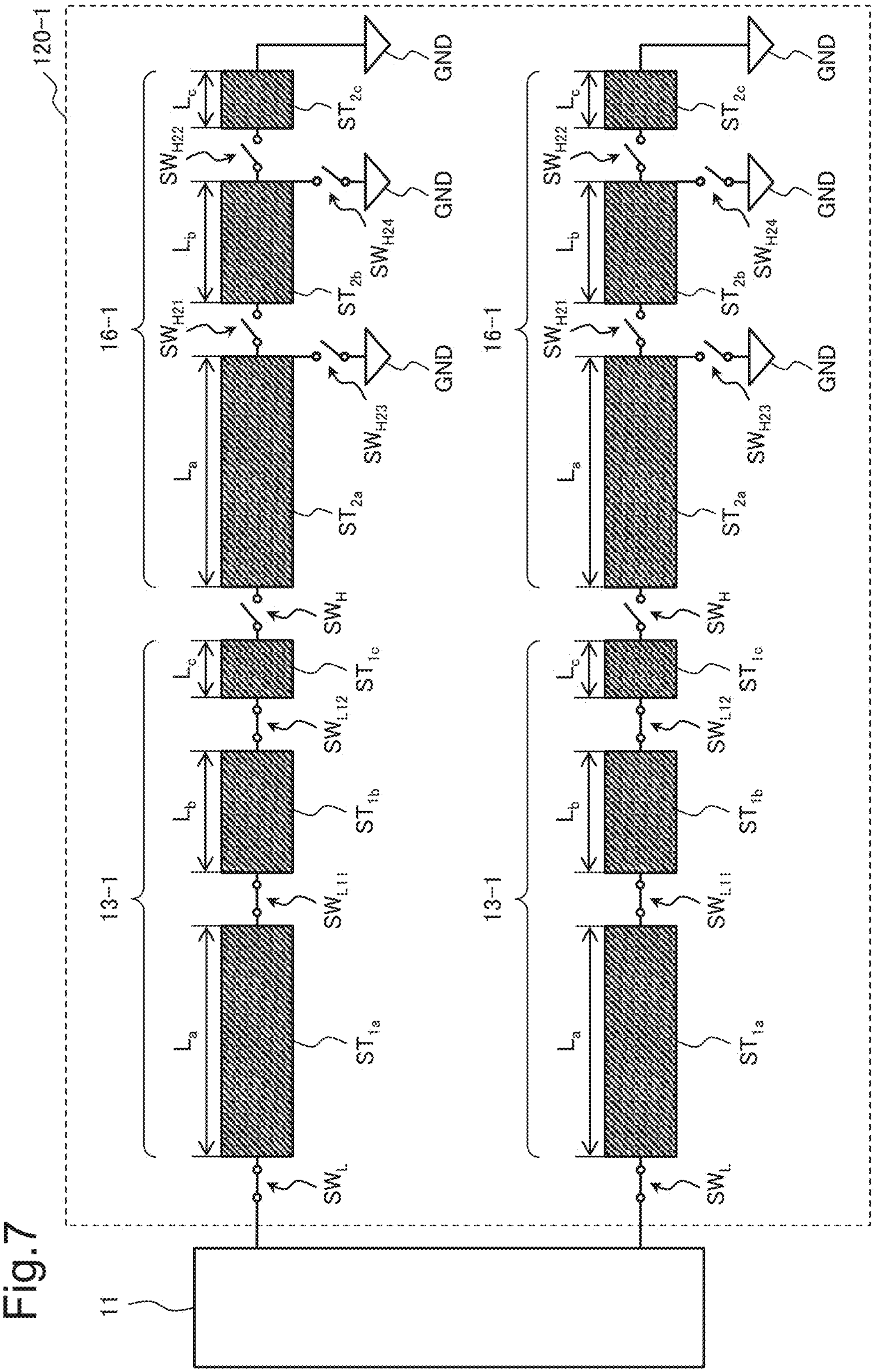
FIG. 7 is a conceptual diagram illustrating an example of an open/close state of a switch included in a phase shifter according to a modification of the first example embodiment.
Figure 8:
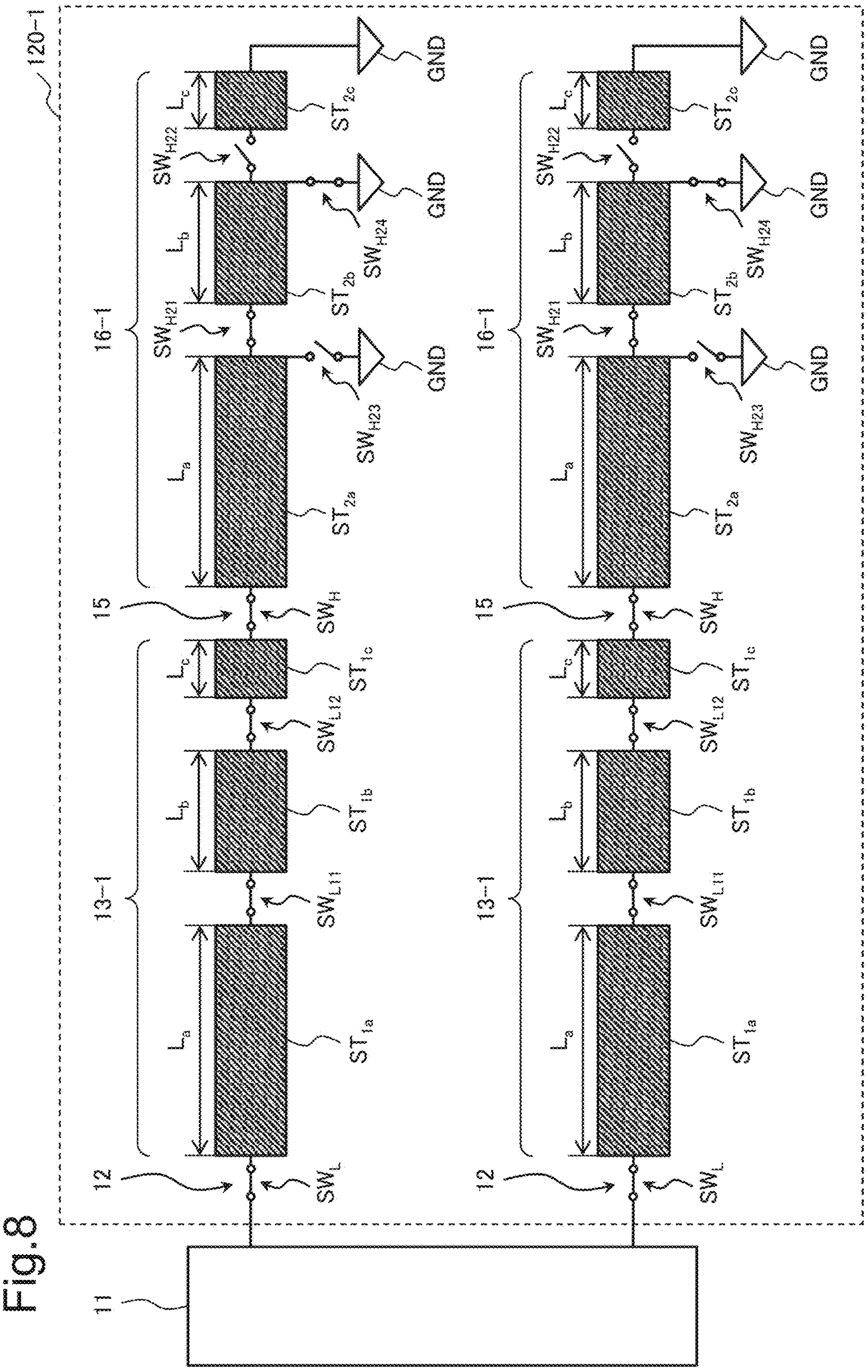
FIG. 8 is a conceptual diagram illustrating an example of an open/close state of a switch included in a phase shifter according to a modification of the first example embodiment.

Next, a phase shifter according to a modification of the present example embodiment will be described with reference to the drawings. In the modification, the electrical lengths of the stubs included in the first stub group 13 and the second stub group are variable. FIGS. 6 to 8 are conceptual diagrams for explaining a phase shifter according to a modification. The phase shifter according to the modification includes a 90-degree hybrid circuit 11 and a stub group 120-1. FIGS. 6 to 8 illustrate an arrangement state in which the phase shifter 10 illustrated in FIG. 1 is rotated counterclockwise by 90 degrees. Therefore, the 90-degree hybrid circuit 11 is rotated counterclockwise by 90 degrees from the state of FIG. 1. Since the 90-degree hybrid circuit 11 has the same configuration as that of FIG. 1, a detailed description thereof will be omitted.

The stub group 120-1 includes a first switch group 12, a first stub group 13-1, a second switch group 15, and a second stub group 16-1. The stub group 120-1 includes two variable-length stubs. The two variable-length stubs have similar configurations.

The first switch group 12 has a configuration similar to that included in the phase shifter 10 (FIG. 1). The first switch group 12 includes two first switches $SW_L$. The first switch $SW_L$ is a phase transition switch using a phase transition of an insulator-metal of the vanadium dioxide $VO_2$. The first switch $SW_L$ includes vanadium dioxide $VO_2$ that undergoes phase transition from the insulation phase to the metal phase in the first phase transition temperature range $T_L$. The vanadium dioxide $VO_2$ is an insulation phase at a temperature lower than the first phase transition temperature range $T_L$. Therefore, the first switch $SW_L$ is turned OFF in a state where the temperature is controlled to be lower than the first phase transition temperature range $T_L$. The vanadium dioxide $VO_2$ is a metal phase at a temperature higher than the first phase transition temperature range $T_L$. Therefore, the first switch $SW_L$ is turned ON in a state where the temperature is controlled to be higher than the first phase transition temperature range $T_L$. FIG. 6 illustrates a state in which all the first switches $SW_L$ included in the first switch group 12 are temperature-controlled to a temperature lower than the first phase transition temperature range $T_L$, and all the first switches $SW_L$ are turned OFF.

The first stub group 13-1 includes two sets of a first stub $ST_{1a}$, a first stub $ST_{1b}$, a first stub $ST_{1c}$, a first switch $SW_{L11}$, and a first switch $SW_{L12}$. One set of the first stub $ST_{1a}$, the first switch $SW_{L11}$, the first stub $ST_{1b}$, the first switch $SW_{L12}$, and the first stub $ST_{1c}$ constitutes one variable-length stub. The electrical length of the first stub $ST_{1a}$ is $L_a$. The electrical length of the first stub $ST_{1b}$ is $L_b$. The electrical length of the first stub $ST_{1c}$ is $L_c$. The electrical lengths of the first stub $ST_{1a}$, the first stub $ST_{1b}$, and the first stub $ST_{1c}$ are set according to the wavelength of the transmission/reception target radio wave. The first switch $SW_{L11}$ and the first switch $SW_{L12}$ are phase transition switches whose phase transition temperature is in the first phase transition temperature range $T_L$ and which includes vanadium dioxide $VO_2$.

The first end of the first stub $ST_{1a}$ is connected to the second end of the first switch $SW_L$ included in the first switch group 12. The second end of the first stub $ST_{1a}$ is connected to the first end of the first switch $SW_{L11}$. The second end of the first switch $SW_{L11}$ is connected to the first end of the first stub $ST_{1b}$. The second end of the first stub $ST_{1b}$ is connected to the first end of the first switch $SW_{L12}$. The second end of the first switch $SW_{L12}$ is connected to the first end of the first stub $ST_{1c}$. The second end of the first stub $ST_{1c}$ is connected to the first end of a second switch $SW_H$ included in the second switch group 15.

For example, in a case where the temperatures of the first switch $SW_{L11}$ and the first switch $SW_{L12}$ can be individually controlled, the electrical lengths of the two variable-length stubs included in the first stub group 13-1 can be controlled to $L_a$, $L_a+L_b$, and $L_a+L_b+L_c$. In a case where the first switch $SW_{L11}$ is turned OFF, the electrical length of the variable-length stub is $L_a$. In a case where the first switch $SW_{L11}$ is turned ON and the first switch $SW_{L12}$ is turned OFF, the electrical length of the variable-length stub is $L_a+L_b$. In a case where the first switch $SW_{L11}$ and the first switch $SW_{L12}$ are turned ON, the electrical length of the variable-length stub is $L_a+L_b+L_c$.

The second switch group 15 has a configuration similar to that included in the phase shifter 10 (FIG. 1). The second switch group 15 includes two second switches $SW_H$. The second switch $SW_H$ is a phase transition switch using a phase transition of an insulator-metal of the vanadium dioxide $VO_2$. The second switch $SW_H$ includes vanadium dioxide $VO_2$ that undergoes phase transition from the insulation phase to the metal phase in a second phase transition temperature range $T_H$ that is higher than the first phase transition temperature range $T_L$. At a temperature lower than the second phase transition temperature range $T_H$, the vanadium dioxide $VO_2$ included in the second switch $SW_H$ is an insulation phase. Therefore, the second switch $SW_H$ is turned OFF in a state where the temperature is controlled to be lower than the second phase transition temperature range $T_H$. At a temperature higher than the second phase transition temperature range $T_H$, the vanadium dioxide $VO_2$ included in the second switch $SW_H$ is a metal phase. Therefore, the second switch $SW_H$ is turned ON in a state where the temperature is controlled to be higher than the second phase transition temperature range $T_H$. FIG. 6 illustrates a state in which all the second switches $SW_H$ included in the second switch group 15 are temperature-controlled to be lower than the second phase transition temperature range $T_H$. In the state of FIG. 6, all the second switches $SW_H$ are turned OFF.

The second stub group 16-1 includes two sets of a second stub $ST_{2a}$, a second stub $ST_{2b}$, a second stub $ST_{2c}$, a second switch $SW_{H21}$, a second switch $SW_{H22}$, a second switch $SW_{H23}$, and a second switch $SW_{H24}$. One set of the second stub $ST_{2a}$, the second stub $ST_{2b}$, the second stub $ST_{2c}$, the second switch $SW_{H21}$, the second switch $SW_{H22}$, the second switch $SW_{H23}$, and the second switch $SW_{H24}$ constitutes one variable-length stub. The electrical length of the second stub $ST_{2a}$ is $L_a$. The electrical length of the second stub $ST_{2b}$ is $L_b$. The electrical length of the second stub $ST_{2c}$ is $L_c$. The electrical lengths of the second stub $ST_{2a}$, the second stub $ST_{2b}$, and the second stub $ST_{2c}$ are set according to the wavelength of the transmission/reception target radio wave. The second switch $SW_{H21}$, the second switch $SW_{H22}$, the second switch $SW_{H23}$, and the second switch $SW_{H24}$ are phase transition switches including vanadium dioxide $VO_2$ whose phase transition temperature is in the second phase transition temperature range $T_H$.

The first end of the second stub $ST_{2a}$ is connected to the second end of the second switch $SW_H$ included in the second switch group 15. The second end of the second stub $ST_{2a}$ is connected to the first ends of the second switch $SW_{H21}$ and the second switch $SW_{H23}$. The second end of the second switch $SW_{H21}$ is connected to the first end of the second stub $ST_{2b}$. The second end of the second switch $SW_{H23}$ is grounded. The second end of the second stub $ST_{2b}$ is connected to the first ends of the second switch $SW_{H22}$ and the second switch $SW_{H24}$. The second end of the second switch $SW_{H22}$ is connected to the first end of the second stub $ST_{2c}$. The second end of the second switch $SW_{L24}$ is grounded. The second end of the second stub $ST_{2c}$ is grounded.

For example, the temperatures of the second switch $SW_{H21}$, the second switch $SW_{H22}$, the second switch $SW_{H23}$, and the second switch $SW_{H24}$ are configured to be individually controllable. In such a configuration, the electrical lengths of the two variable-length stubs included in the second stub group 16-1 can be controlled to $L_a$, $L_a+L_b$, and $L_a+L_b+L_c$. In a case where the second switch $SW_{H21}$ is turned OFF, the electrical length of the variable-length stub is $L_a$. In a case where the second switch $SW_{H21}$ is turned ON and the second switch $SW_{H22}$ is turned OFF, the electrical length of the variable-length stub is $L_a+L_b$. In a case where the second switch $SW_{H21}$ and the second switch $SW_{H22}$ are turned ON, the electrical length of the variable-length stub is $L_a+L_b+L_c$.

The two variable-length stubs included in the second stub group 16-1 function as open stubs or short stubs according to ON/OFF control of the second switch $SW_{H23}$ and the second switch $SW_{H24}$. In a case where the second switch $SW_{H21}$ and the second switch $SW_{H23}$ are turned OFF, the two variable-length stubs function as open stubs having an electrical length $L_a$. In a case where the second switch $SW_{H21}$ is turned OFF and the second switch $SW_{H23}$ is turned ON, the two variable-length stubs function as short stubs having an electrical length $L_a$. In a case where the second switch $SW_{H21}$ is turned ON, the second switch $SW_{H22}$ is turned OFF, and the second switch $SW_{H23}$ is turned OFF, the two variable-length stubs function as open stubs having an electrical length of $L_a+L_b$. In a case where the second switch $SW_{H21}$ is turned ON, the second switch $SW_{H22}$ is turned OFF, and the second switch $SW_{H23}$ is turned ON, the two variable-length stubs function as short stubs having an electrical length of $L_a+L_b$. In a case where the second switch $SW_{H21}$ is turned ON, the second switch $SW_{H22}$ is turned ON, the second switch $SW_{H23}$ is turned OFF, and the second switch $SW_{H24}$ is turned OFF, the two variable-length stubs function as short stubs having electrical lengths $L_a+L_b+L_c$.

FIG. 7 is a conceptual diagram illustrating an example of a connection state of the plurality of switches SW included in the stub group 120-1. In the connection state of FIG. 7, all the first switches $SW_L$ included in the first switch group 12 are turned ON. That is, the first stub $ST_{1a}$, the first stub $ST_{1b}$, and the first stub $ST_{1c}$ included in the first stub group 13-1 are turned ON. All the second switches $SW_H$ included in the second switch group 15 are OFF. That is, the second switch $SW_{H21}$, the second switch $SW_{H22}$, the second switch $SW_{H23}$, and the second switch $SW_{H24}$ included in the second stub group 16-1 are turned OFF. In the example of FIG. 7, the first stub $ST_{1a}$, the first stub $ST_{1b}$, and the first stub $ST_{1c}$ included in the first stub group 13-1 function as open stubs having an electrical length of $L_a+L_b+L_c$.

FIG. 8 is a conceptual diagram illustrating another example of the connection state of the plurality of switches SW included in the stub group 120-1. In the connection state of FIG. 8, all the first switches $SW_L$ included in the first switch group 12 are turned ON. That is, the first stub $ST_{1a}$, the first stub $ST_{1b}$, and the first stub $ST_{1c}$ included in the first stub group 13-1 are turned ON. Some of the second switches $SW_H$ included in the second switch group 15 are turned ON. In the example of FIG. 8, the second switch $SW_{H21}$ and the second switch $SW_{H24}$ are turned ON, and the second switch $SW_{H22}$ and the second switch $SW_{H23}$ are turned OFF. In the example of FIG. 8, the first stub $ST_{1a}$, the first stub $ST_{1b}$, the first stub $ST_{1c}$, the second stub $ST_{2a}$, and the second stub $ST_{2b}$ function as short stubs having an electrical length of $2L_a+2L_b+L_c$.

As described above, the phase shifter of the present example embodiment includes the 90-degree hybrid circuit and the variable-length stub group. The variable-length stub group includes two variable-length stubs connected to the 90-degree hybrid circuit. The variable-length stub includes a first switch, a first stub, a second switch, and a second stub. The first switch is connected to the 90-degree hybrid circuit and includes vanadium dioxide of a first composition that undergoes phase transition in a first phase transition temperature range. The first stub is connected to the first switch. The second switch is connected to the first stub and includes vanadium dioxide of a second composition that undergoes phase transition in a second phase transition temperature range higher than the first phase transition temperature range. The second stub is connected to the second switch and has an end grounded.

The phase shifter of the present example embodiment functions as an open stub in a case where the first switch is turned ON and the second switch is turned OFF. The phase shifter of the present example embodiment functions as a short stub in a case where the first switch is turned ON and the second switch is turned ON. The phase shifter of the present example embodiment can control the second switch even in a case where the environmental temperature exceeds the first phase transition temperature range. Therefore, according to the present example embodiment, it is possible to provide a phase shifter that can be stably controlled without depending on the environmental temperature. For example, even if all the switches are configured by the second switches, the phase shifter can stably operate without depending on the environmental temperature. However, in such a configuration, even in a normal temperature range where the environmental temperature is lower than the first phase transition temperature range, it is necessary to control the temperature of the second switch to a higher second phase transition temperature. According to the configuration of the present example embodiment, when the environmental temperature is in the normal temperature range, the temperature of the first switch can be controlled at the first phase transition temperature that is lower. Therefore, power consumption can be reduced as compared with a phase shifter including second switches in which all switches operate at high temperature.

In one aspect of the present example embodiment, the variable-length stub group includes a first switch group, a first stub group, a second switch group, and a second stub group. The first switch group includes two first switches. The first stub group includes two first stubs. The second switch group includes two second switches. The second stub group includes two second stubs. According to the present aspect, by controlling the switches included in the first switch group and the second switch group for each group, it is possible to provide a phase shifter that can be stably controlled without depending on the environmental temperature.

In an aspect of the present example embodiment, the 90-degree hybrid circuit includes four transmission lines having the same electrical length. The electrical length of the first stub and the second stub is half the electrical length of the transmission line. According to the present aspect, by adjusting the characteristic impedances of the four transmission lines, the first stub, and the second stub, the signal can be phase-shifted to a desired phase.

A phase shifter according to an aspect of the present example embodiment includes a control circuit that controls temperatures of two first switches included in a first switch group and two second switches included in a second switch group. The control circuit may be disposed in the antenna device on which the phase shifter is mounted. According to the present aspect, ON/OFF of the first switch and the second switch can be controlled by controlling the temperatures of the first switch and the second switch using the control circuit.

In one aspect of the present example embodiment, the control circuit individually controls the temperature of at least one of the two first switches included in the first switch group and the two second switches included in the second switch group. According to the present aspect, ON/OFF of the first switch and the second switch can be individually controlled by individually controlling the temperatures of the first switch and the second switch.

In one aspect of the present example embodiment, the control circuit collectively controls the temperature of at least two of the two first switches included in the first switch group and the two second switches included in the second switch group. According to the present aspect, by collectively controlling the temperatures of at least two of the plurality of first switches and the plurality of second switches, it is possible to collectively control ON/OFF of at least two of the first switches and the second switches.

In one aspect of the present example embodiment, the first stub group includes a plurality of first stubs connected in series by at least one first switch. The second stub group includes a plurality of second stubs connected in series by at least one second switch. According to the present aspect, the electrical lengths of the first stub and the second stub are variable.

Second Example Embodiment

Next, an antenna device according to a second example embodiment will be described with reference to the drawings. The antenna device of the present example embodiment is an antenna device including the phase shifter according to the first example embodiment. The following configuration is an example, and does not limit the structure of the antenna device on which the phase shifter of the present disclosure is mounted.

Configuration

Figure 9:
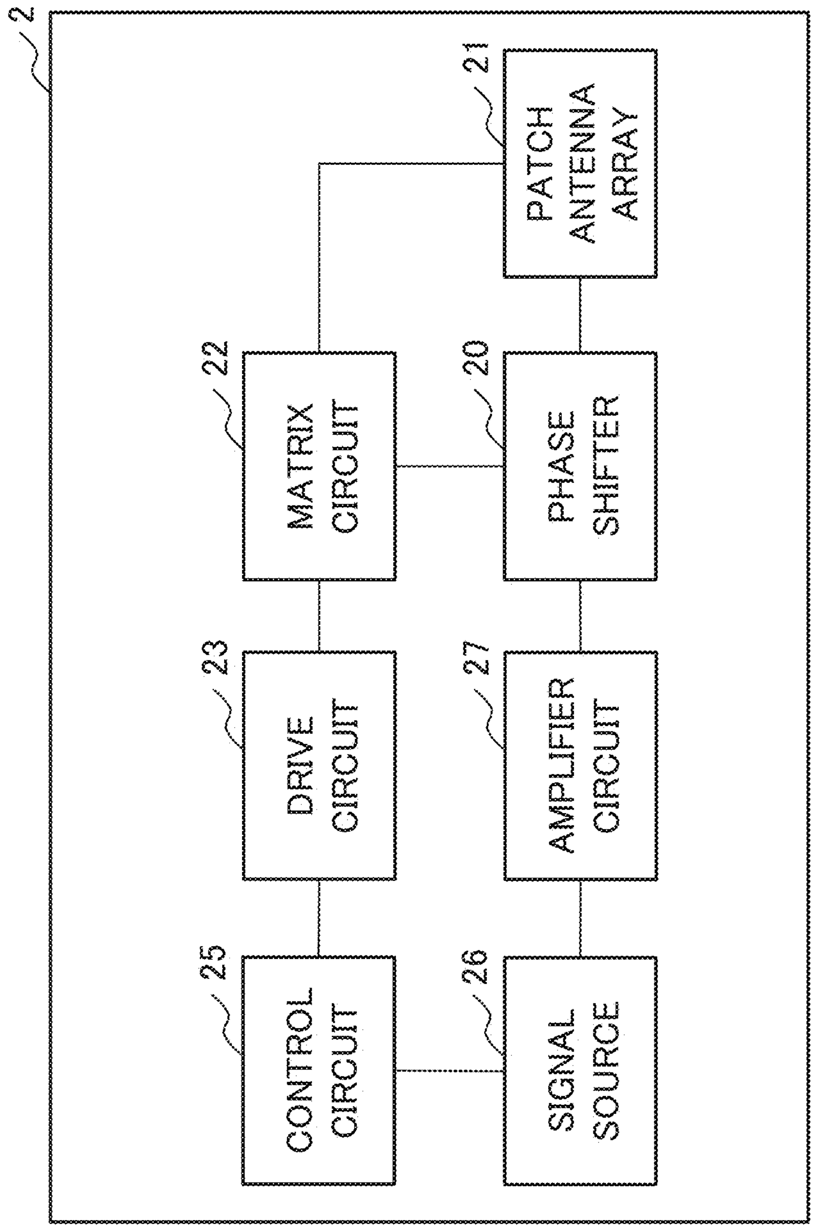
FIG. 9 is a block diagram illustrating an example of a configuration of an antenna device according to a second example embodiment.

FIG. 9 is a block diagram illustrating an example of a configuration of an antenna device 2. The antenna device 2 includes a phase shifter 20, a patch antenna array 21, a matrix circuit 22, a drive circuit 23, a control circuit 25, a signal source 26, and an amplifier circuit 27. In the present example embodiment, the phase shifter 20 is relevant to the phase shifter 10 of the first example embodiment.

Figure 10:
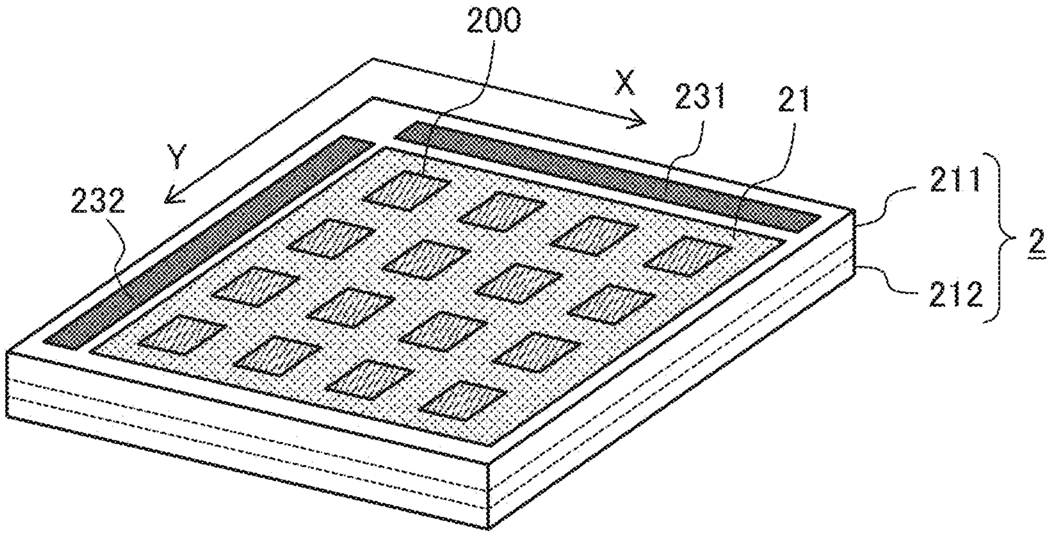
FIG. 10 is a conceptual diagram illustrating an example of a configuration of an antenna device according to the second example embodiment.

FIG. 10 is a conceptual diagram illustrating an example of an external appearance of the antenna device 2. The antenna device 2 is formed on a first substrate 211 and a second substrate 212. The antenna device 2 has a structure in which the first substrate 211 and the second substrate 212 are stacked. For example, an insulation phase (not illustrated) is sandwiched between the first substrate 211 and the second substrate 212.

The first substrate 211 includes a transmission surface of the transmission target radio wave. The patch antenna array 21 is arranged on the upper surface (first surface) of the first substrate 211. The patch antenna array 21 includes a plurality of patch antennas 200 arranged in a lattice pattern. The plurality of patch antennas 200 are arranged in a two-dimensional array. In the example of FIG. 10, the plurality of patch antennas 200 are arranged along the X direction and the Y direction. The plurality of patch antennas 200 are formed in a phased array. For example, the material of the first substrate 211 is a material used for a silicon substrate, glass, or the like. For example, the material of the first substrate 211 may be an insulating film such as an oxide film or a nitride film. The material of the first substrate 211 is not limited as long as the transmission target radio wave can be transmitted.

The patch antenna 200 is a plate-shaped radiation element. In the example of FIG. 10, the patch antenna 200 has a square shape. The shape of the patch antenna 200 is not limited to a square shape, and may be a circular shape or other shapes. The patch antenna 200 is an open type resonator. The patch antenna 200 resonates at a frequency that matches an integral multiple of a ½ wavelength of a length of the patch antenna 200. The size of the patch antenna 200 is set according to the wavelength of the transmission target radio wave. In order to avoid a decrease in the Q factor due to radio wave radiation and operate the patch antenna 200 as a resonator, a high dielectric layer having a high dielectric constant may be interposed between the first substrate 211 and the second substrate 212. In a case where the high dielectric layer is interposed between the first substrate 211 and the second substrate 212, the thickness of the high dielectric layer and the width of the patch antenna 200 are made sufficiently small with respect to the wavelength of the transmission target radio wave.

A first drive circuit 231 and a second drive circuit 232 are mounted on the first substrate 211. The first drive circuit 231 and the second drive circuit 232 constitute a drive circuit 23. Under the control of the control circuit 25, the first drive circuit 231 and the second drive circuit 232 drive the TFT. The drive circuit 23 individually drives the plurality of TFTs included in the matrix circuit 22. The first drive circuit 231 is a circuit for performing addressing in the X direction. The second drive circuit 232 is a circuit for performing addressing in the Y direction. For example, the first drive circuit 231 and the second drive circuit 232 are formed on an upper surface (first surface) of the first substrate 211. The first drive circuit 231 and the second drive circuit 232 may be formed inside the first substrate 211.

Figure 11:
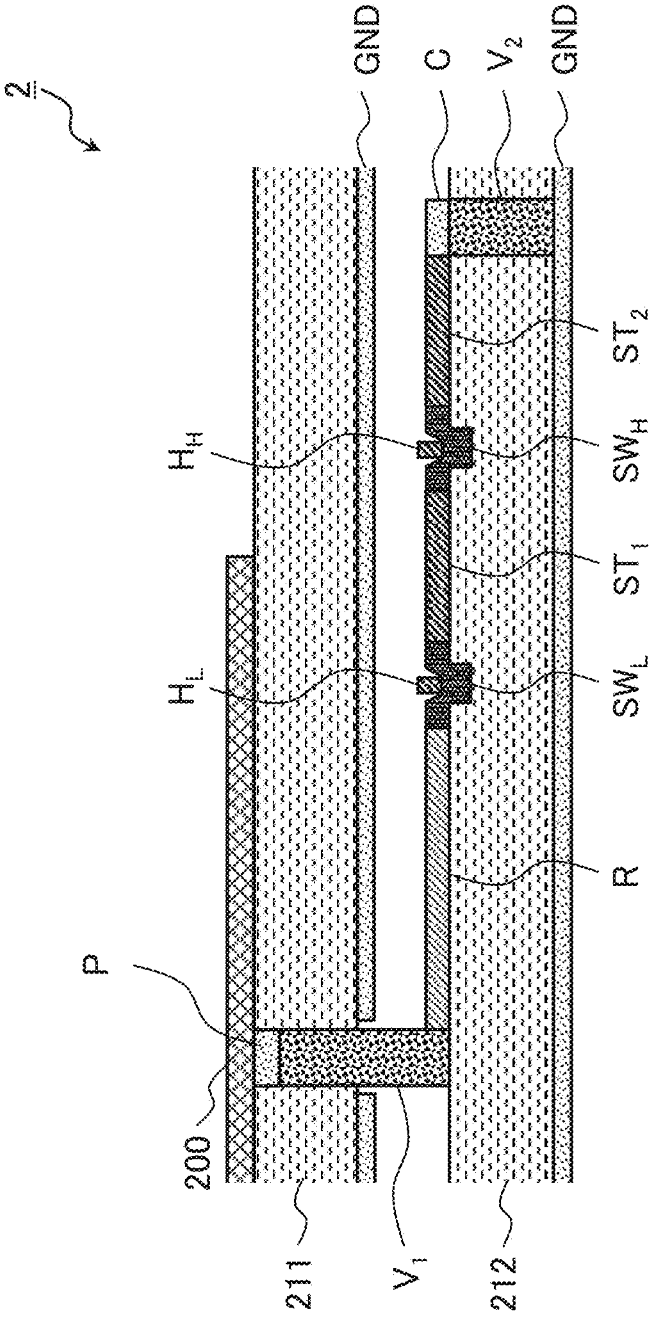
FIG. 11 is a cross-sectional view of a part of an antenna device according to the second example embodiment.

FIG. 11 is a partial cross-sectional view illustrating a cross section obtained by cutting a portion including the patch antenna 200. FIG. 11 is a partial cross-sectional view taken along the transmission line from the 90-degree hybrid circuit included in the phase shifter to the variable-length stub. FIG. 11 illustrates a part associated with one of the plurality of patch antennas 200 included in the patch antenna array 21.

A ground layer GND is formed on a lower surface (second surface) of the first substrate 211 facing the first surface. An opening is formed in the ground layer GND below the patch antenna 200. A via $V_1$ is arranged inside the opening. The via $V_1$ is made of a conductive material. The patch antenna 200 is electrically connected to a transmission line R of the phase shifter 20 arranged on the upper surface of the second substrate 212 via the via $V_1$ arranged inside the opening.

The second substrate 212 is relevant to a backplane of a liquid crystal display. For example, the material of the second substrate 212 is a material or glass used for a silicon substrate. The second substrate 212 may be made of a material other than silicon or glass as long as the transmission target radio wave can be transmitted. The material of the second substrate 212 is not limited as long as the transmission target radio wave can be transmitted.

The matrix circuit 22 is formed on the second substrate 212. The matrix circuit 22 has a structure in which a plurality of thin film transistors (TFTs) are arranged in a two-dimensional array. The matrix circuit 22 has a configuration in which a plurality of TFTs are arranged in a two-dimensional array. The matrix circuit 22 is formed on the upper surface of the second substrate 212 using a TFT process technology. For example, polysilicon (also referred to as low-temperature polysilicon) manufactured at a low temperature using an excimer laser crystal method or the like can be applied to the TFT. Each of the plurality of TFTs included in the matrix circuit 22 is associated with one of the plurality of patch antennas 200 included in the patch antenna array 21. For example, the TFT includes a semiconductor layer such as amorphous silicon or polysilicon.

A signal layer including the phase shifter 20 is formed above the matrix circuit 22. In the signal layer, a transmission line included in the phase shifter 20, a switch group including a plurality of switching elements, a phase shift wiring, a signal line connecting the switch group, and the like are formed. The phase shifter 20 has the configuration of the first example embodiment. The phase shifter 20 is disposed for each patch antenna 200. A single antenna unit is configured for each patch antenna 200. The function of the phase shifter 20 is expressed for each antenna unit. The phase shifter 20 may be disposed between the patch antennas 200 disposed on the upper surface of the first substrate 211.

In FIG. 11, the phase shifter 20 relevant to the patch antenna 200 is electrically connected to the patch antenna 200 via the via $V_1$ penetrating the first substrate 211. The upper portion of the via $V_1$ is connected to a feeding point P of the patch antenna 200. The lower portion of the via $V_1$ is connected to the first end (left end) of the transmission line R included in the 90-degree hybrid circuit. The second end (right end) of the transmission line is connected to the first end (left end) of the first switch $SW_L$. The second end (right end) of the first switch $SW_L$ is connected to the first end (left end) of the first stub $ST_1$. The second end (right end) of the first stub $ST_1$ is connected to the first end (left end) of the second switch $SW_H$. The second end (right end) of the second switch $SW_H$ is connected to the ground layer GND via a contact layer C and a via $V_2$.

FIG. 11 illustrates electric heating wires ($H_L$, $H_H$) used for temperature control of the first switch $SW_L$ and the second switch $SW_H$. The electric heating wire $H_L$ is used to control the temperature of the thin film of the vanadium dioxide $VO_2$ included in the first switch $SW_L$. The electric heating wire $H_H$ is used to control the temperature of the thin film of the vanadium dioxide $VO_2$ included in the second switch $SW_H$. For example, the electric heating wires ($H_L$, $H_H$) are achieved by an alloy containing nickel Ni or chromium Cr as a main component. The electric heating wires ($H_L$, $H_H$) may be achieved by an alloy containing chromium Cr, iron Fe, and aluminum Al as main components. The material of the electric heating wires ($H_L$, $H_H$) is not particularly limited. For example, the first switch $SW_L$ and the second switch $SW_H$ may be configured such that ON/OFF is controlled by voltage control or current control.

Figure 12:
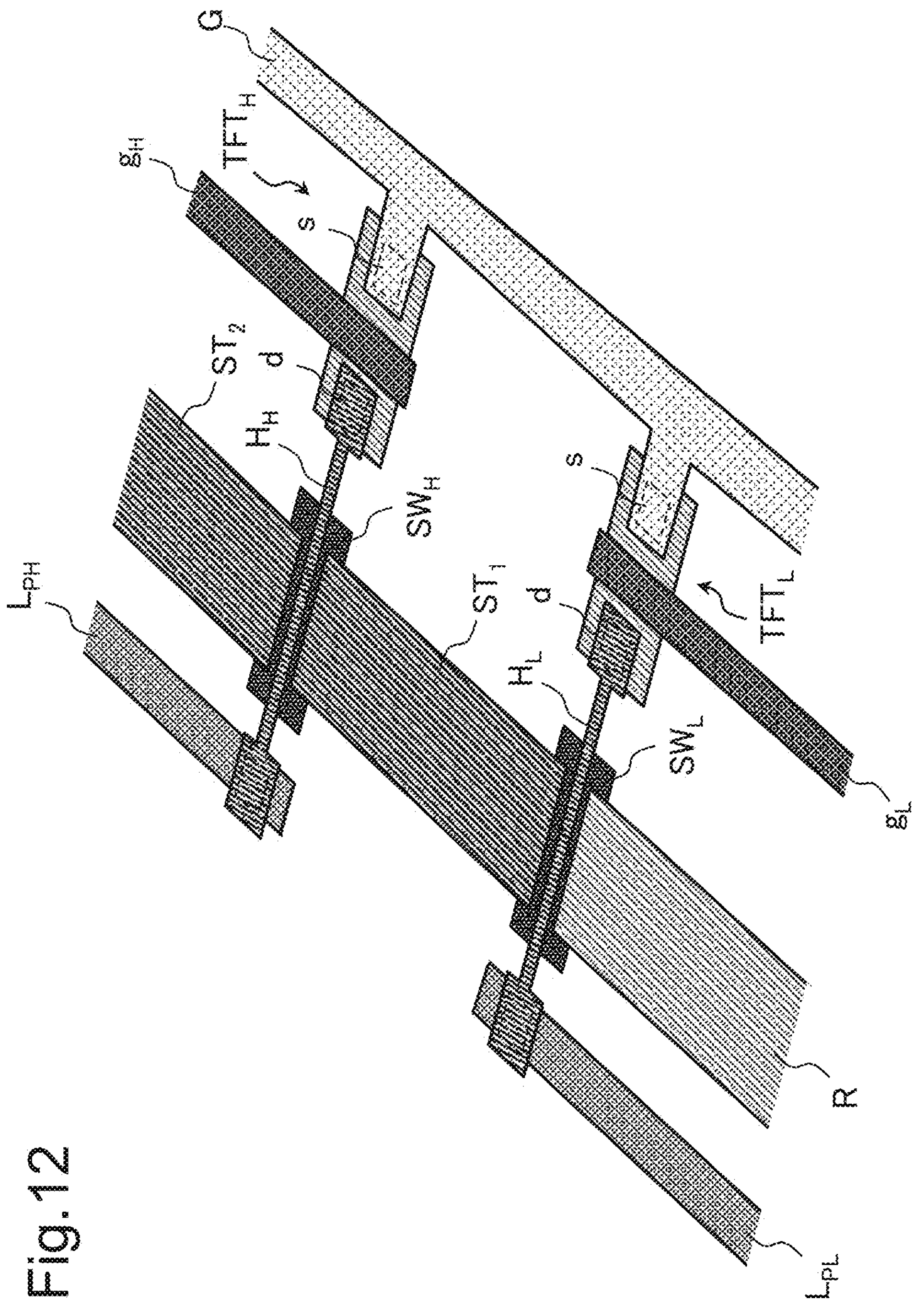
FIG. 12 is a conceptual diagram of a part of an antenna device according to the second example embodiment.

FIG. 12 is a conceptual diagram for explaining a configuration example of the switch SW including a switching element including a thin film of vanadium dioxide $VO_2$. Although only one of the two variable-length stubs included in the variable-length stub group is illustrated in FIG. 12, the switches SW included in the two variable-length stubs included in the same variable-length stub group are also temperature-controlled. FIG. 12 illustrates $TFT_L$ for controlling the first switch $SW_L$ and $TFT_H$ for controlling the second switch $SW_H$. $TFT_L$ and $TFT_H$ are included in the matrix circuit 22. The matrix circuit 22 may include a TFT other than $TFT_L$ and $TFT_H$.

In the example of FIG. 12, the first switch $SW_L$ is arranged between the transmission line R and the first stub $ST_1$. The transmission line R and the first stub $ST_1$ are electrically connected via the first switch $SW_L$. The electric heating wire HL is thermally connected to the first switch $SW_L$. The first end of the electric heating wire $H_L$ is connected to a power supply line $L_{PL}$. The second end of the electric heating wire $H_L$ is connected to the drain d of the $TFT_L$. The source s of the $TFT_L$ is connected to a ground line G. The gate of the $TFT_L$ is connected to a control line $g_L$. The second switch $SW_H$ is disposed between the first stub $ST_1$ and the second stub $ST_2$. The first stub $ST_1$ and the second stub $ST_2$ are electrically connected via the second switch $SW_H$. The electric heating wire $H_H$ is thermally connected to the second switch $SW_H$. The first end of the electric heating wire $H_H$ is connected to a power supply line $L_{PH}$. The second end of the heating wire $H_H$ is connected to the drain d of the $TFT_H$. The source s of the $TFT_H$ is connected to the ground line G. The gate of $TFT_H$ is connected to a control line $g_H$.

The gate of the $TFT_L$ is connected to a control line $g_L$. When a voltage exceeding the gate voltage is applied to the control line gr, the $TFT_L$ transitions to ON, and the drain and the source are conducted. As a result, a current flows into the heating wire $H_L$ through the power supply line $L_{PL}$, and the temperature of the heating wire $H_L$ rises. The temperature of the heating wire $H_L$ is controlled according to the amount of current flowing through the power supply line $L_{PL}$. On the other hand, the gate of the $TFT_H$ is connected to the control line $g_H$. When a voltage exceeding the gate voltage is applied to the control line $g_H$, the $TFT_H$ transitions to ON, and the drain and the source are conducted. As a result, the current flows into the heating wire $H_H$ through the power supply line $L_{PH}$, and the temperature of the heating wire $H_H$ rises. The temperature of the heating wire $H_H$ is controlled according to the amount of current flowing through the power supply line $L_{PH}$. For example, a common control line may be connected to each of the gates of the $TFT_L$ and the $TFT_H$. With the configuration, ON/OFF of the $TFT_L$ and the $TFT_H$ can be collectively controlled.

When the temperature of the first switch $SW_L$ in contact with the electric heating wire $H_L$ exceeds the first phase transition temperature range $T_L$, the first switch $SW_L$ transitions to ON. When the first switch $SW_L$ transitions to ON, the transmission line R and the first stub $ST_1$ are electrically connected. When the temperature of the second switch $SW_H$ in contact with the heating wire $H_H$ exceeds the second phase transition temperature range $T_H$, the second switch $SW_H$ transitions to ON. When the second switch $SW_H$ transitions to ON, the transmission line R, the first stub $ST_1$, and the second stub $ST_2$ are electrically connected.

The control circuit 25 drives the drive circuit 23 in accordance with a control signal from the outside. The control circuit 25 drives the drive circuit 23 by an active matrix drive system. The control circuit 25 outputs a control signal from the outside to the signal source 26. Further, the control circuit 25 outputs a control signal for transmitting a signal to be transmitted toward the communication target to the signal source 26. For example, the control circuit 25 is achieved by a microcomputer or a microcontroller. Further, the control circuit 25 controls the switch SW including a switching element having a thin film of vanadium dioxide $VO_2$ by using the drive circuit 23. The control circuit 25 controls ON/OFF of the switch SW by controlling current/voltage applied to the control line according to a control signal from the outside. For example, a dedicated circuit for controlling ON/OFF of the switch SW may be added to the antenna device 2.

For example, the control circuit 25 includes a central processing unit (CPU), a random access memory (RAM), a read only memory (ROM), a flash memory, and the like. The control circuit 25 executes control and processing according to a program stored in advance. The control circuit 25 executes control and processing according to a program in accordance with a preset schedule and timing, an instruction included in a control signal from the outside, and the like.

The signal source 26 is connected to the control circuit 25 and the amplifier circuit 27. The signal source 26 acquires a control signal from the control circuit 25. The signal source 26 generates a signal transmitted from the patch antenna array 21 in response to the control signal. The signal source 26 generates a signal in a high frequency band used in mobile communication. The signal source 26 outputs the generated signal to the amplifier circuit 27.

The amplifier circuit 27 is connected to the amplifier circuit 27 and the phase shifter. The amplifier circuit 27 acquires a signal generated by the signal source 26. The amplifier circuit 27 amplifies the acquired signal. The amplifier circuit 27 outputs the amplified signal to an input terminal of the phase shifter 20.

The signal reaching the input end of the phase shifter 20 is phase-shifted by the amount of phase shift relevant to the line length set in the phase shifter 20 and the dielectric constant of the substrates (the first substrate 211 and the second substrate 212). The phase-shifted signal propagates to the patch antenna 200 via the via $V_1$. The signal propagated to the patch antenna 200 is transmitted from the patch antenna 200 as a transmission target radio wave. The radio wave transmitted from the patch antenna 200 is based on a signal output from the signal source 26 according to the control signal output from the control circuit 25. The information included in the signal is not particularly limited.

For example, an electromagnetic interference reduction structure may be formed between wirings such as adjacent transmission lines. The electromagnetic interference reduction structure includes a plurality of vias penetrating the second substrate 212. The plurality of vias penetrate the second substrate 212 from the upper surface on which the transmission line is formed to the ground layer GND on the lower surface. For example, a conductive portion is formed inside the via and around the opening. For example, conductive plating is applied to the conductive portion of the via. The conductive portion of the via electrically connects the upper surface on which the transmission line is formed and the ground layer GND on the lower surface. The electromagnetic interference reduction structure suppresses electromagnetic interference between adjacently arranged transmission lines.

For example, a dummy element (not illustrated) including vanadium dioxide $VO_2$ may be disposed around a phase shifter formed on the second substrate 212. In order to perform the phase transition at a standard phase transition temperature (about 67 degrees Celsius), no additive element may be added to a dummy element. The phase transition temperature of vanadium dioxide $VO_2$ included in the dummy element is relevant to a temperature range (phase transition temperature range) including an insulation transition temperature and a metal transition temperature. For example, the control circuit 25 calculates the temperature around the dummy element by measuring the electric resistance value of the dummy element. The control circuit 25 can measure the temperature in accordance with a change in the electric resistance value of the dummy element. If the phase transition temperature is known, an additive element may be included in vanadium dioxide $VO_2$ included in the dummy element. A dummy element may be disposed on the first substrate 211 as long as the temperature around the phase shifter can be measured.

For example, when a plurality of dummy elements are disposed on the first substrate 211 or the second substrate 212, control according to a temperature or a temperature distribution around the phase shifter 20 can be achieved. In a case where an abnormality is detected in the measured temperature or temperature distribution, the control circuit 25 can control two first switches included in the first switch group and two second switches included in the second switch group. With such control, even in a case where the substrate temperature becomes abnormally high and the switching becomes unstable, the phase shifter of the antenna device 2 can be controlled, so that malfunction of the antenna device 2 can be prevented.

As described above, the antenna device according to the present example embodiment includes an antenna unit including the phase shifter according to the first example embodiment and the patch antenna arranged above the phase shifter. According to the present example embodiment, it is possible to provide an antenna device including a phase shifter that can be stably controlled without depending on the environmental temperature.

An antenna device according to an aspect of the present example embodiment includes a patch antenna array in which a plurality of antenna units are arranged in an array. The antenna device of the present aspect includes a patch array antenna configured by a plurality of patch antennas having a size relevant to a wavelength of a transmission/reception target signal. According to the antenna device of the present aspect, a patch array antenna capable of controlling directivity can be configured.

An antenna device according to an aspect of the present example embodiment includes at least one dummy element including vanadium dioxide that undergoes phase transition at a known phase transition temperature. The control circuit measures the temperature in accordance with a change in the electric resistance value of the dummy element. In a case where an abnormality is detected in the measured temperature, the control circuit controls two first switches included in the first switch group and two second switches included in the second switch group. According to the present aspect, by controlling the switches included in the first switch group and the second switch group according to the temperature measured using the dummy element, it is possible to prevent an erroneous operation of the antenna device.

Third Example Embodiment

Figure 13:
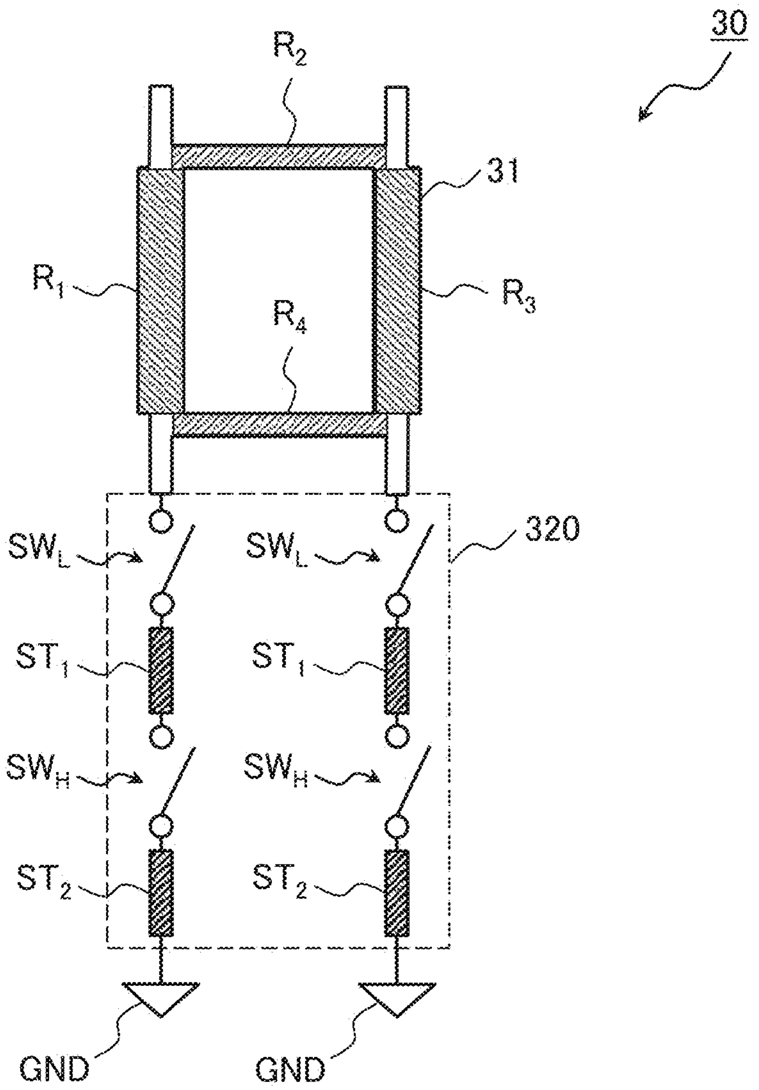
FIG. 13 is a conceptual diagram illustrating an example of a configuration of a phase shifter according to a third example embodiment.

Next, a phase shifter according to a third example embodiment will be described with reference to the drawings. The phase shifter of the present example embodiment has a configuration obtained by simplifying the phase shifters according to the first to second example embodiments. FIG. 13 is a conceptual diagram illustrating an example of a configuration of a phase shifter 30 according to the present example embodiment. The phase shifter 30 includes a 90-degree hybrid circuit 31 and a variable-length stub group 320.

The 90-degree hybrid circuit 31 includes four transmission lines ($R_1$, $R_2$, $R_3$, $R_4$). The variable-length stub group 320 includes two variable-length stubs connected to the 90-degree hybrid circuit 31. In the example of FIG. 13, one of the two variable-length stubs is connected to the other end of the transmission line $R_1$ and one end of the transmission line $R_4$. The other of the two variable-length stubs is connected to the other end of the transmission line $R_3$ and the other end of the transmission line $R_4$. Each variable-length stub includes a first switch $SW_L$, a first stub $ST_1$, a second switch $SW_H$, and a second stub $ST_2$. The first switch $SW_L$ is connected to the 90-degree hybrid circuit and includes vanadium dioxide of a first composition that phase-transitions between an insulation phase and a metal phase in the first phase transition temperature range. The first stub $ST_1$ is connected to the first switch $SW_L$. The second switch $SW_H$ is connected to the first stub $ST_1$ and includes vanadium dioxide of a second composition that phase-transitions between an insulation phase and a metal phase in the second phase transition temperature range higher than the first phase transition temperature range. The second stub $ST_2$ is connected to the second switch $SW_H$.

The phase shifter of the present example embodiment functions as an open stub in a case where the first switch is turned ON and the second switch is turned OFF. The phase shifter of the present example embodiment functions as a short stub in a case where the first switch is turned ON and the second switch is turned ON. In the phase shifter of the present example embodiment, in a case where the environmental temperature rapidly rises, the second switch transitions to ON and functions as a short stub. Therefore, according to the present example embodiment, it is possible to provide a phase shifter that can be stably controlled without depending on the environmental temperature.

(Hardware)

Here, a hardware configuration for executing the control and processing according to each example embodiment of the present disclosure will be described using an information processing device 90 (computer) of FIG. 14 as an example. The information processing device 90 in FIG. 14 is a configuration example for executing the control and processing of each example embodiment, and does not limit the scope of the present disclosure.

Figure 14:
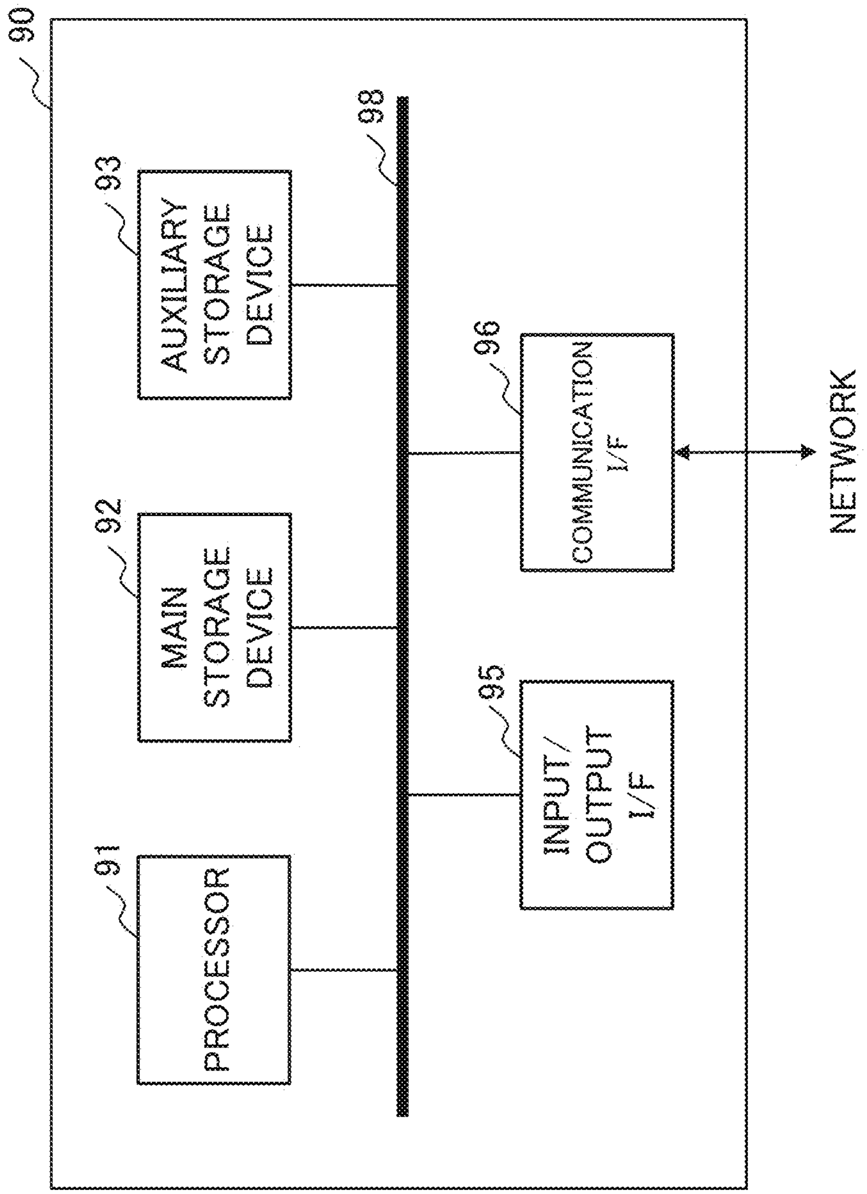
FIG. 14 is a block diagram illustrating an example of a hardware configuration that achieves control and processing according to each example embodiment.

As illustrated in FIG. 14, the information processing device 90 includes a processor 91, a main storage device 92, an auxiliary storage device 93, an input/output interface 95, and a communication interface 96. In FIG. 14, the interface is abbreviated as an I/F. The processor 91, the main storage device 92, the auxiliary storage device 93, the input/output interface 95, and the communication interface 96 are data-communicably connected to each other via a bus 98. The processor 91, the main storage device 92, the auxiliary storage device 93, and the input/output interface 95 are connected to a network such as the Internet or an intranet via communication interface 96.

The processor 91 develops a program (instruction) stored in the auxiliary storage device 93 or the like in the main storage device 92. For example, the program is a software program for executing the control and processing of each example embodiment. The processor 91 executes the program developed in the main storage device 92. The processor 91 executes the control and processing according to each example embodiment by executing the program.

The main storage device 92 has a region in which a program is developed. A program stored in the auxiliary storage device 93 or the like is developed in the main storage device 92 by the processor 91. The main storage device 92 is implemented by, for example, a volatile memory such as a dynamic random access memory (DRAM). A nonvolatile memory such as a magneto resistive random access memory (MRAM) may be configured and added as the main storage device 92.

The auxiliary storage device 93 stores various data such as programs. The auxiliary storage device 93 is implemented by a local disk such as a hard disk or a flash memory. Various data may be stored in the main storage device 92, and the auxiliary storage device 93 may be omitted.

The input/output interface 95 is an interface for connecting the information processing device 90 and a peripheral device. The communication interface 96 is an interface for connecting to an external system or device through a network such as the Internet or an intranet based on a standard or a specification. The input/output interface 95 and the communication interface 96 may be shared as an interface connected to an external device.

An input device such as a keyboard, a mouse, or a touch panel may be connected to the information processing device 90 as necessary. These input devices are used to input information and settings. In a case where a touch panel is used as the input device, a screen having a touch panel function serves as an interface. The processor 91 and the input device are connected via the input/output interface 95.

The information processing device 90 may be provided with a display device for displaying information. In a case where a display device is provided, the information processing device 90 may include a display control device (not illustrated) for controlling display of the display device. The display device may be connected to the information processing device 90 via the input/output interface 95.

The information processing device 90 may be provided with a drive device. The drive device mediates reading of data and a program stored in a recording medium and writing of a processing result of the information processing device 90 to the recording medium between the processor 91 and the recording medium (program recording medium). The information processing device 90 and the drive device are connected via an input/output interface 95.

The above is an example of the hardware configuration for enabling the control and processing according to each example embodiment of the present invention. The hardware configuration of FIG. 14 is an example of a hardware configuration for executing the control and processing of each example embodiment, and does not limit the scope of the present invention. A program for causing a computer to execute the control and processing according to each example embodiment is also included in the scope of the present invention.

Further, a program recording medium in which the program according to each example embodiment is recorded is also included in the scope of the present invention. The recording medium can be implemented by, for example, an optical recording medium such as a compact disc (CD) or a digital versatile disc (DVD). The recording medium may be implemented by a semiconductor recording medium such as a universal serial bus (USB) memory or a secure digital (SD) card. The recording medium may be implemented by a magnetic recording medium such as a flexible disk, or another recording medium. In a case where a program executed by the processor is recorded in a recording medium, the recording medium is associated to a program recording medium.

The components of each example embodiment may be made in any combination. The components of each example embodiment may be implemented by software. The components of each example embodiment may be implemented by a circuit.

Although the present invention has been described with reference to the example embodiments, the present invention is not limited to the above example embodiments. Various modifications that can be understood by those skilled in the art can be made to the configuration and details of the present invention within the scope of the present invention.

REFERENCE SIGNS LIST

2 antenna device
10 phase shifter
11 90-degree hybrid circuit
12 first switch group
13 first stub group
15 second switch group
16 second stub group
21 patch antenna array
22 matrix circuit
23 drive circuit
25 control circuit
120 variable-length stub group
211 first substrate
212 second substrate
231 first drive circuit
232 second drive circuit

What is claimed is:

1. A phase shifter comprising:
a 90-degree hybrid circuit; and
a variable-length stub group including two variable-length stubs connected to the 90-degree hybrid circuit, wherein
each variable-length stub includes
a first switch connected to the 90-degree hybrid circuit and including vanadium dioxide of a first composition that phase-transitions between an insulation phase and a metal phase in a first phase transition temperature range,
a first stub connected to the first switch,
a second switch connected to the first stub and including vanadium dioxide of a second composition that phase-transitions between an insulation phase and a metal phase in a second phase transition temperature range higher than the first phase transition temperature range, and
a second stub connected to the second switch and having an end grounded.

2. The phase shifter according to claim 1, wherein
the variable-length stub group includes
a first switch group including the two first switches,
a first stub group including the two first stubs,
a second switch group including the two second switches, and
a second stub group including the two second stubs.

3. The phase shifter according to claim 2, wherein the 90-degree hybrid circuit includes
four transmission lines having a same electrical length, and
electrical lengths of the first stubs and the second stubs are half an electrical length of the transmission line.

4. The phase shifter according to claim 3, further comprising
a control circuit that comprises
a memory storing instructions, and
a processor connected to the memory and configured to execute the instructions to
control temperatures of the two first switches included in the first switch group and the two second switches included in the second switch group.

5. The phase shifter according to claim 4, wherein
the processor of the control circuit is configured to execute the instructions to
individually control temperature of at least one of the two first switches included in the first switch group and the two second switches included in the second switch group.

6. The phase shifter according to claim 4, wherein
the processor of the control circuit is configured to execute the instructions to
collectively control temperature of at least two of the two first switches included in the first switch group and the two second switches included in the second switch group.

7. The phase shifter according to claim 2, wherein
the first stub group includes a plurality of the first stubs connected in series by at least one of the first switches, and
the second stub group includes a plurality of the second stubs connected in series by at least one of the second switches.

8. The phase shifter according to claim 4, comprising:

at least one dummy element including vanadium dioxide that phase-transitions in a known phase transition temperature range, wherein the processor of the control circuit is configured to execute the instructions to measure a temperature according to a change in an electric resistance value of the dummy element, and control, in a case where an abnormality is detected in the measured temperature, the two first switches included in the first switch group and the two second switches included in the second switch group.

9. An antenna device, comprising an antenna unit including a phase shifter according to claim 1, and a patch antenna disposed above the phase shifter.

10. The antenna device according to claim 9, further comprising a patch antenna array in which a plurality of the antenna units are arranged in an array.

* * * * *